(12) United States Patent
More

(10) Patent No.: US 11,830,772 B2
(45) Date of Patent: *Nov. 28, 2023

(54) FINFETS WITH EPITAXY REGIONS HAVING MIXED WAVY AND NON-WAVY PORTIONS

(71) Applicant: Taiwan Semiconductor Manufacturing Co., Ltd., Hsinchu (TW)

(72) Inventor: Shahaji B. More, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/654,626

(22) Filed: Mar. 14, 2022

(65) Prior Publication Data
US 2022/0208613 A1 Jun. 30, 2022

Related U.S. Application Data

(63) Continuation of application No. 17/125,048, filed on Dec. 17, 2020, now Pat. No. 11,315,834.

(Continued)

(51) Int. Cl.
*H01L 21/8234* (2006.01)
*H01L 29/66* (2006.01)
(Continued)

(52) U.S. Cl.
CPC .. *H01L 21/823418* (2013.01); *H01L 21/0245* (2013.01); *H01L 21/02293* (2013.01);
(Continued)

(58) Field of Classification Search
CPC .......... H01L 21/02293; H01L 21/0245; H01L 21/02532; H01L 21/823412;
(Continued)

(56) References Cited

U.S. PATENT DOCUMENTS 8,962,400 B2 2/2015 Tsai et al.
9,093,514 B2 7/2015 Tsai et al.
(Continued)

FOREIGN PATENT DOCUMENTS

CN 110783268 A 2/2020
KR 20170059234 A 5/2017
KR 20200008306 A 1/2020

*Primary Examiner* — Cheung Lee
(74) *Attorney, Agent, or Firm* — Slater Matsil, LLP

(57) ABSTRACT

A method includes forming a first fin-group having has a plurality of semiconductor fins, and a second fin-group. The plurality of semiconductor fins include a first semiconductor fin, which is farthest from the second fin-group among the first fin-group, a second semiconductor fin, and a third semiconductor fin, which is closest to the second fin-group among the first fin-group. The method further includes performing an epitaxy process to form an epitaxy region based on the plurality of semiconductor fins. The epitaxy region includes a first portion and a second portion. The first portion is in middle between the first semiconductor fin and the second semiconductor fin. The first portion has a first top surface. The second portion is in middle between the second semiconductor fin and the third semiconductor fin. The second portion has a second top surface lower than the first top surface.

20 Claims, 20 Drawing Sheets

Related U.S. Application Data

(60) Provisional application No. 63/078,968, filed on Sep. 16, 2020, provisional application No. 63/065,291, filed on Aug. 13, 2020.

(51) Int. Cl.
    *H01L 27/092*     (2006.01)
    *H01L 21/02*      (2006.01)
    *H01L 29/08*      (2006.01)
    *H01L 29/78*      (2006.01)

(52) U.S. Cl.
CPC ............ *H01L 21/02532* (2013.01); *H01L 21/823431* (2013.01); *H01L 21/823468* (2013.01); *H01L 27/0924* (2013.01); *H01L 29/0843* (2013.01); *H01L 29/0847* (2013.01); *H01L 29/66795* (2013.01); *H01L 29/785* (2013.01); *H01L 21/823412* (2013.01); *H01L 21/823475* (2013.01)

(58) Field of Classification Search
CPC ..... H01L 21/823418; H01L 21/823431; H01L 21/823468; H01L 21/823475; H01L 27/0924; H01L 29/0843; H01L 29/0847; H01L 29/66795; H01L 29/785; H01L 29/78642; H01L 29/78696; H01L 21/02639; H01L 21/0265; H01L 21/76897; H01L 27/0886; H01L 29/1033; H01L 29/41791; H01L 29/42356; B82Y 10/00; B82Y 40/00

See application file for complete search history.

(56) References Cited

U.S. PATENT DOCUMENTS

| | | | |
|---|---|---|---|
| 9,236,267 B2 | 1/2016 | De et al. | |
| 9,245,805 B2 | 1/2016 | Yeh et al. | |
| 9,418,897 B1 | 8/2016 | Ching et al. | |
| 9,520,482 B1 | 12/2016 | Chang et al. | |
| 9,576,814 B2 | 2/2017 | Wu et al. | |
| 9,608,116 B2 | 3/2017 | Ching et al. | |
| 9,812,363 B1 * | 11/2017 | Liao ................ | H01L 21/823431 |
| 9,859,380 B2 | 1/2018 | Lee et al. | |
| 10,297,601 B2 | 5/2019 | Kim et al. | |
| 11,043,424 B2 | 6/2021 | Huang | |
| 11,302,779 B2 | 4/2022 | Choi et al. | |
| 2015/0206875 A1 | 7/2015 | Lee et al. | |
| 2016/0315081 A1 * | 10/2016 | Park ................ | H01L 29/41791 |
| 2017/0148797 A1 | 5/2017 | Kim et al. | |
| 2018/0076050 A1 | 3/2018 | Takemoto | |
| 2018/0151439 A1 | 5/2018 | Huang | |
| 2019/0287859 A1 | 9/2019 | Huang | |
| 2019/0393347 A1 | 12/2019 | Kim et al. | |
| 2020/0020773 A1 | 1/2020 | Choi et al. | |
| 2020/0043793 A1 | 2/2020 | Huang | |
| 2020/0127113 A1 | 4/2020 | Ching et al. | |

\* cited by examiner ed with a liner oxide layer formed using, for example, Atomic Layer Deposition (ALD), High-Density

FINFETS WITH EPITAXY REGIONS HAVING MIXED WAVY AND NON-WAVY PORTIONS

PRIORITY CLAIM AND CROSS-REFERENCE

This application is a continuation of U.S. patent application Ser. No. 17/125,048, entitled "FinFETs With Epitaxy Regions Having Mixed Wavy and Non-Wavy Portions," filed Dec. 17, 2020, which application claims the benefit of the U.S. Provisional Application No. 63/065,291, filed Aug. 13, 2020, and entitled "Mixed Wavy-EPI Multi-Fins PMOS Structure," and the provisional U.S. Patent Application No. 63/078,968, filed Sep. 16, 2020, and entitled "Mixed Wavy-EPI Multi-Fins PMOS Structure," which applications are hereby incorporated herein by reference.

BACKGROUND

In the formation of Fin Field-Effect Transistors, source/drain regions were typically formed by forming semiconductor fins, recessing semiconductor fins to form recesses, and growing epitaxy regions starting from the recesses. The epitaxy regions grown from the recesses of neighboring semiconductor fins may merge with each other, and the resulting epitaxy regions may have planar top surfaces. Source/drain contact plugs are formed to electrically connect to the source/drain regions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
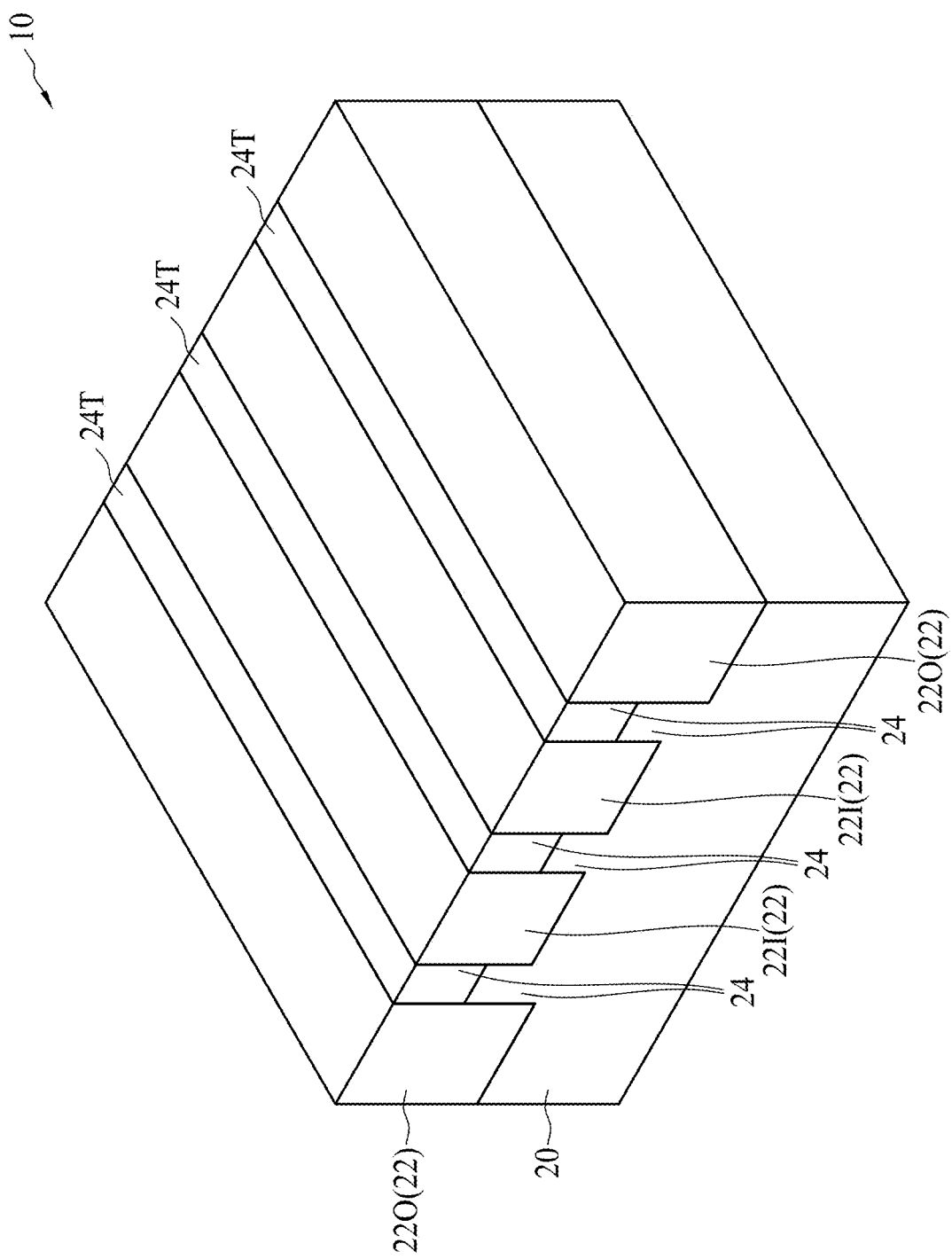
FIGS. 1, 2A, 2B, 3A, 3B, 3C, 4A, 4B, 4C, 5-7, 8A, 8B, 9, 10, 11A, 11B, and 11C illustrate the perspective views and cross-sectional views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and the method of forming the same are provided. In accordance with some embodiments of the present disclosure, a merged epitaxy region, which may be a source/drain region of a FinFET, is formed based on a plurality of semiconductor fins that forms a fin-group. The merged epitaxy region includes at least a wavy portion and a non-wavy portion, wherein the term "wavy" refers to that a middle portion of a top surface is lower than the top surfaces of opposing portions that are grown from semiconductor fins. The non-wavy portion has the function of preventing fin bending for the entire fin-group, while the wavy portion has an increased contact area than if the portion is formed as non-wavy, and hence the contact resistance is reduced. Accordingly, with the merged epitaxy region including both of the non-wavy portion and the wavy portion, both of the reliability and contact resistance issues are taken care of. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1, 2A, 2B, 3A, 3B, 3C, 4A, 4B, 4C, 5-7, 8A, 8B, 9, 10, 11A, 11B, and 11C illustrate the cross-sectional views of intermediate stages in the formation of FinFETs and the corresponding source/drain regions in accordance with some embodiments of the present disclosure. The corresponding processes are also reflected schematically in the process flow shown in FIG. 12.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. The top surface of substrate 20 may have a (100) surface plane. Substrate 20 may be doped with a p-type or an n-type impurity. Isolation regions 22 such as Shallow Trench Isolation (STI) regions may be formed to extend from a top surface of substrate 20 into substrate 20. The respective process is illustrated as process 202 in the process flow 200 shown in FIG. 12. The portions of substrate 20 between neighboring STI regions 22 are referred to as semiconductor strips 24. The top surfaces of semiconductor strips 24 and the top surfaces of STI regions 22 may be substantially level with each other in accordance with some embodiments.

STI regions 22 may include a liner oxide (not shown), which may be a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed using Flowable Chemical Vapor Deposition (FCVD), spin-on, or the like. In accordance with some embodiments, STI regions 22 may include STI regions 220, which are on the outer sides of fin-groups, as will be discussed in subsequent paragraphs, and STI regions 221, which are formed in inner-group spacings in fin-groups. STI regions 220 may have a greater height than STI regions 221.

In accordance with some embodiments, top portions 24T of semiconductor strips 24 are formed of a material different from the material of the bulk portion of semiconductor substrate 20. For example, top portions 24T may be formed of silicon germanium, which may have a germanium atomic percentage in a range between about 15 percent and about 30 percent. In accordance with some embodiments, top portions 24T are formed before the formation of STI regions 22, and are formed through an epitaxy process to deposit silicon germanium on substrate 20. The top portions 24T may also include a bottom portion that is formed the same material as the underlying bulk portion of semiconductor substrate 20. STI regions 22 are then formed by etching some portions of the epitaxy silicon germanium layer and the underlying substrate 20, and depositing dielectric materials. In accordance with alternative embodiments, top portions 24T are formed after the formation of STI regions 22, and are formed by etching the portions of substrate 20 between STI regions 22, and then performing an epitaxy process to grow a semiconductor material such as silicon germanium into the resulting recesses.

Figure 2A:
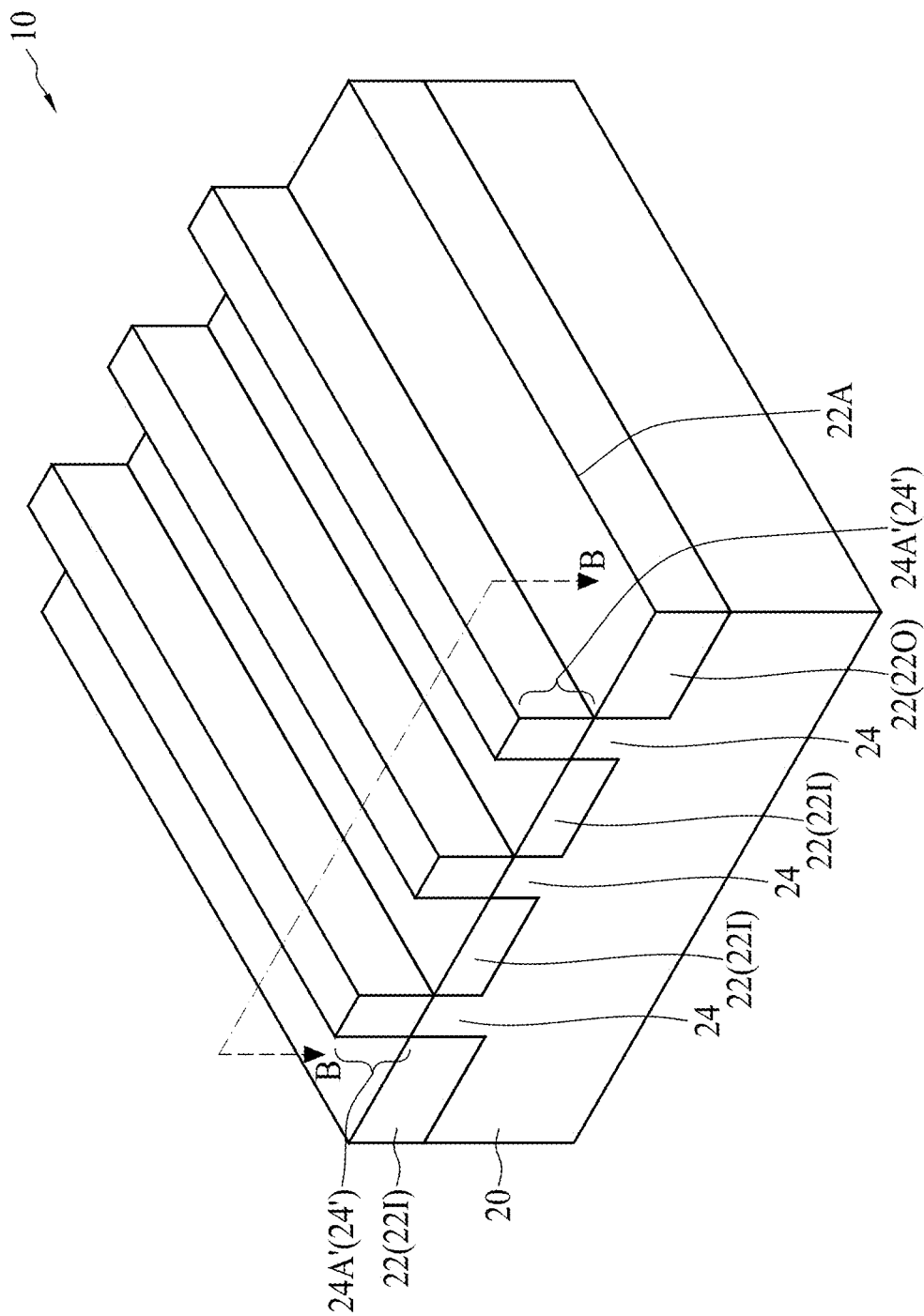
Figure 2B:
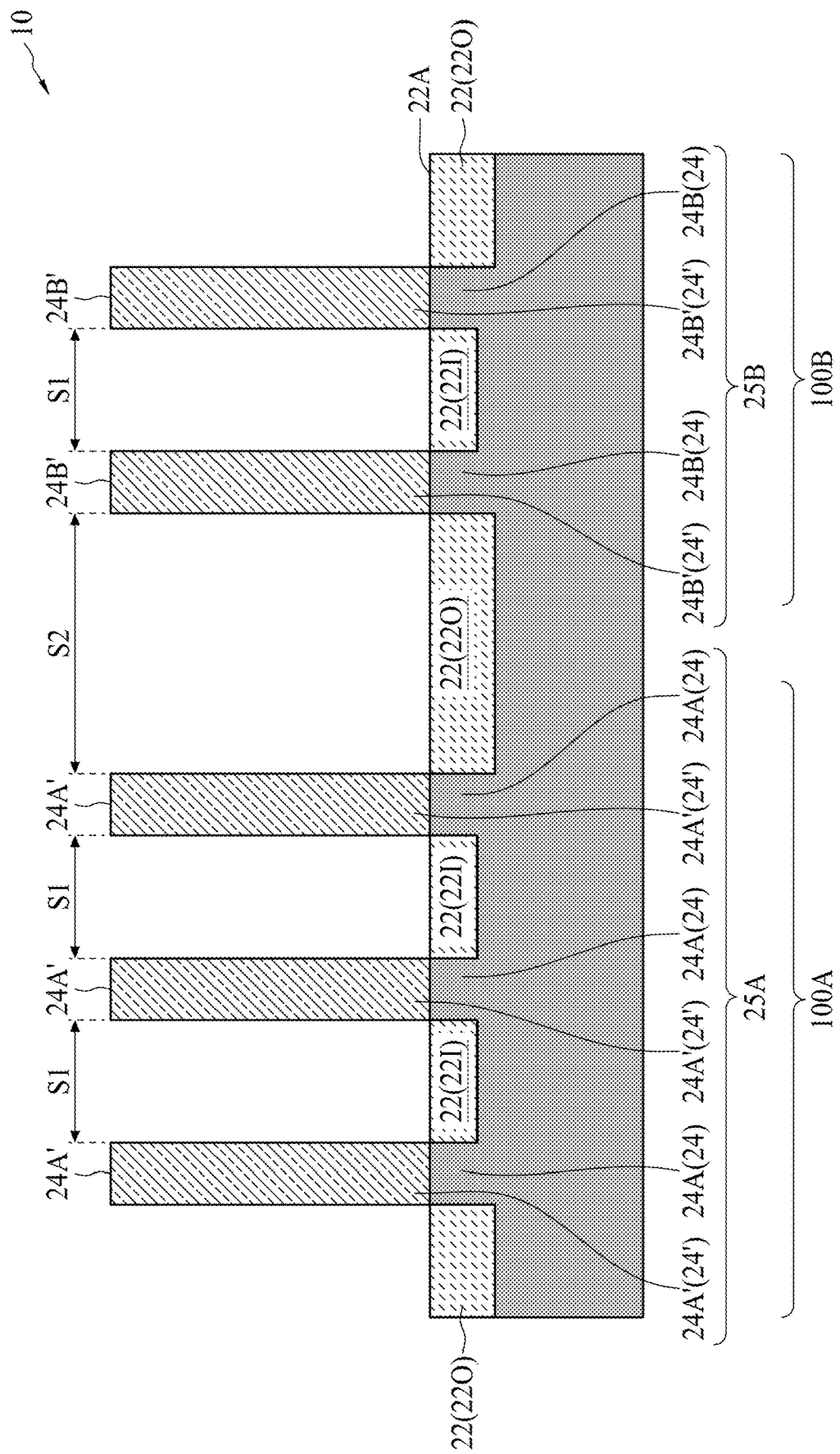

Referring to FIGS. 2A and 2B, STI regions 22 are recessed. FIG. 2B illustrates a cross-sectional view of the reference cross-section B-B in FIG. 2A. FIG. 2A, however, illustrates the left part of the structure shown in FIG. 2B. The top portions of semiconductor strips 24 protrude higher than the top surfaces 22A of STI regions 22 to form protruding fins 24', which include protruding fins 24A' in device region 100A (FIG. 2B), and protruding fins 24B' (FIG. 2B) in device region 100B. The respective process is illustrated as process 204 in the process flow shown in FIG. 12. The portions of semiconductor strips 24 in STI regions 22 are still referred to as semiconductor strips.

Referring to FIG. 2B, protruding fins 24A' are collectively referred to as fin-group 25A, and protruding fins 24B' are collectively referred to as fin-group 25B. In accordance with some embodiments, the inner spacing S1 between the neighboring fins in the same fin-group 25A and 25B are smaller than inter-group spacing S2, for example, with ratio S2/S1 being greater than about 2, or greater than about 5. The recessing of STI regions 22 may be performed using a dry etching process, wherein a mixture of HF and $NH_3$ may be used as the etching gas. The etching may also be performed using a mixture of $NF_3$ and $NH_3$ as the etching gas. During the etching process, plasma may be generated. Argon may also be included. In accordance with alternative embodiments of the present disclosure, the recessing of STI regions 22 is performed using a wet etching process. The etching chemical may include HF solution, for example.

In accordance with some embodiments, the fins for forming the FinFETs may be formed/patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

As shown in FIG. 2B, wafer 10 includes a first device region 100A and a second device region 100B, each for forming a FinFET therein. The FinFET formed in the first device region 100A may be a p-type FinFET, while the FinFET formed in the second device region 100B may be an n-type FinFET or a p-type FinFET. To distinguish the features in device region 100A and device region 100B from each other, a feature formed in device region 100A may be referred to with a reference number followed by letter "A," and a feature formed in device region 100B may be referred to with a reference number followed by letter "B." For example, the semiconductor strips 24 in device region 100A are referred to as 24A, which are collectively referred to a strip-group 25A, and the semiconductor strips 24 in device region 100B are referred to as 24B, which are collectively referred to a strip-group 25B.

In accordance with some embodiments, the top surfaces 22A of STI regions 22 may be higher than, lower than, or level with the bottom surfaces of top portions 24T (FIG. 1). Accordingly, after the recessing of STI regions 22, an entirety of protruding fins 24A' may be formed of silicon germanium, and may or may not extend down into the spaces between the remaining STI regions 22. Alternatively, the bottom portions of protruding fins 24A' may be formed of silicon, while the top portions of protruding fins 24A' may be formed of silicon germanium.

Figure 3A:
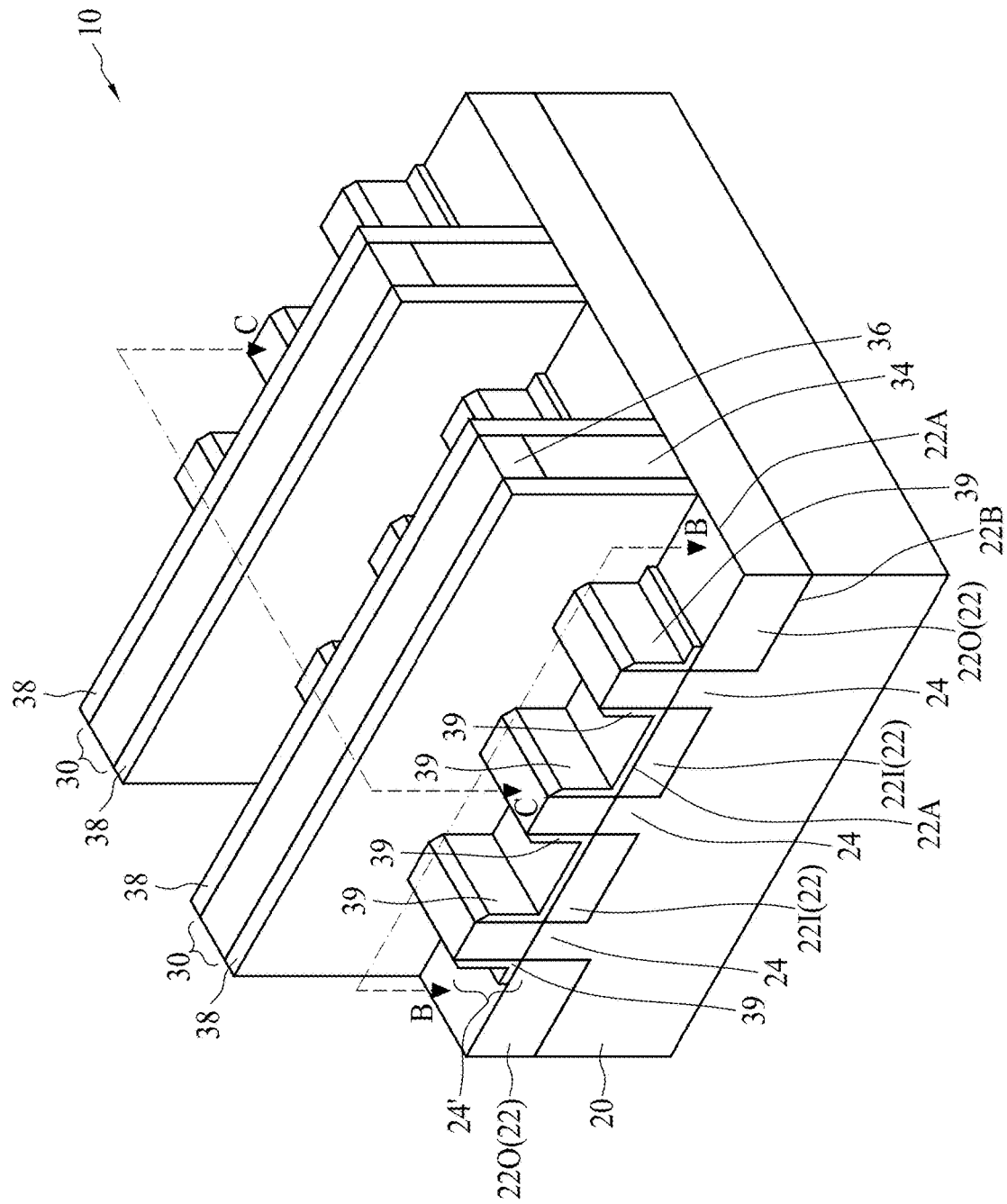
Figure 3B:
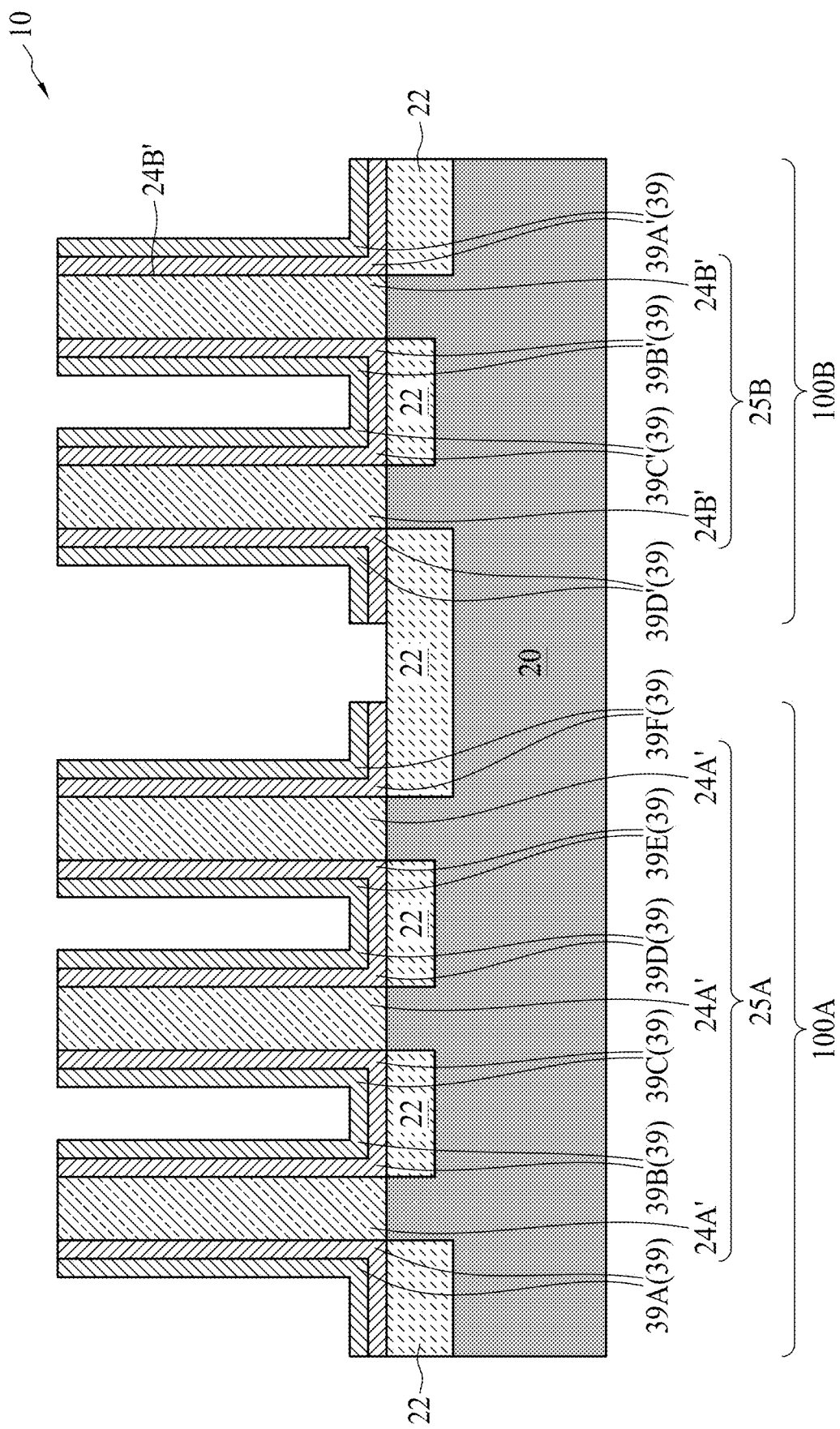
Figure 3C:
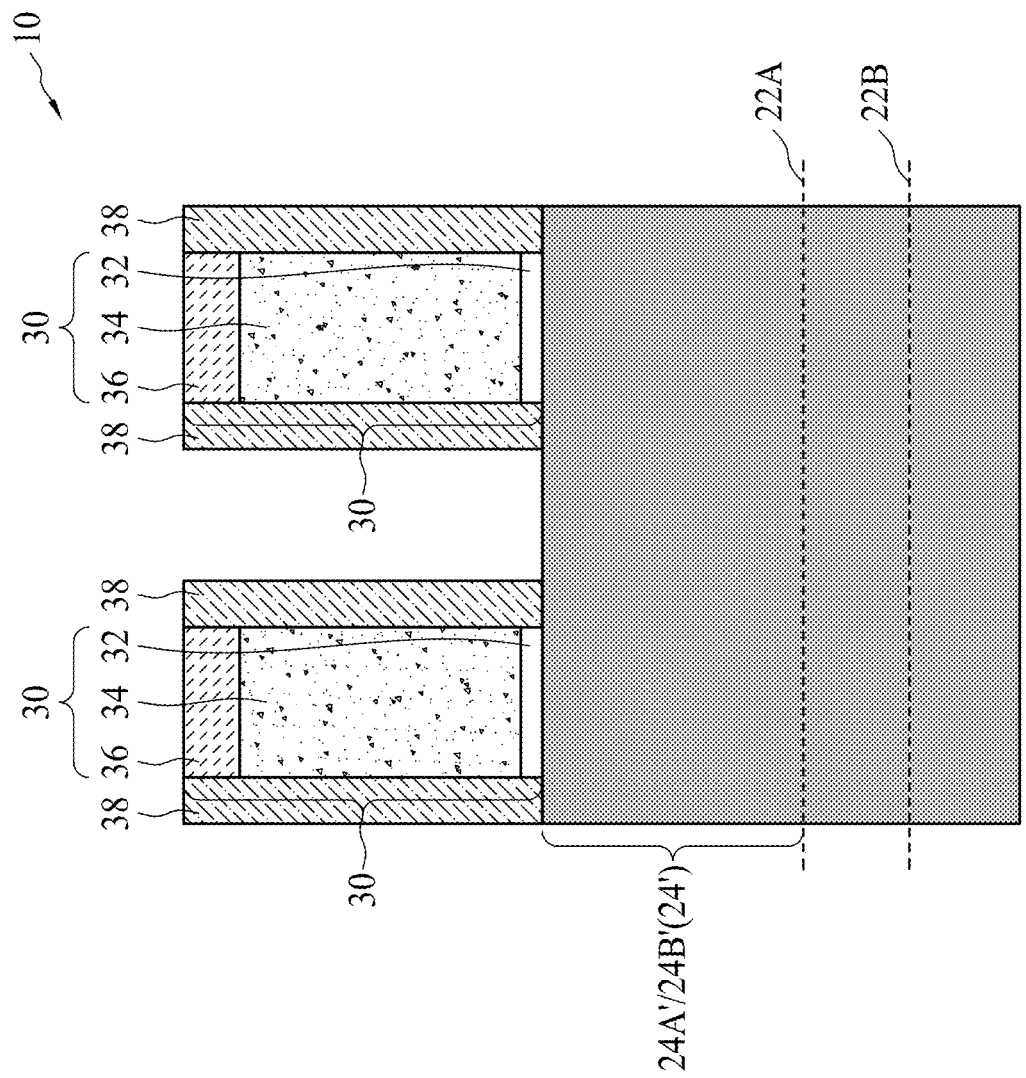

Referring to FIGS. 3A, 3B, and 3C, dummy gate stacks 30 are formed on the top surfaces and the sidewalls of protruding fins 24A' and 24B'. The respective process is illustrated as process 206 in the process flow shown in FIG. 12. The cross-sections shown in FIGS. 3B and 3C are obtained from the reference cross-sections B-B and C-C, respectively, in FIG. 3A. In FIG. 3C and subsequent FIG. 11C, the level of the top surfaces 22A of STI regions 22 (also refer to FIG. 3A) may be illustrated, and semiconductor fins 24A' and 24B' are higher than top surfaces 22A. Bottom surfaces 22B (also refer to FIG. 3A) of STI regions 221 are also illustrated in the cross-sectional views. STI regions 221 are located at the levels between 22A and 22B, and are not shown in FIGS. 3C and 11C since they are in different planes than illustrated.

Dummy gate stacks 30 may include dummy gate dielectrics 32 (FIG. 3C) and dummy gate electrodes 34 over dummy gate dielectrics 32. Dummy gate electrodes 34 may be formed using, for example, amorphous silicon or polysilicon, and other materials may also be used. Each of dummy gate stacks 30 may also include one (or a plurality of) hard mask layer 36 over dummy gate electrode 34. Hard mask layers 36 may be formed of silicon nitride, silicon carbo-nitride, or the like. Dummy gate stacks 30 also have lengthwise directions perpendicular to the lengthwise directions of protruding fins 24A' and 24B'. In accordance with some embodiments, the dummy gate stacks 30 on protruding fins 24A' and the dummy gate stacks 30 on protruding fins 24B' are discrete dummy gate stacks that are physically separated from each other. In accordance with alternative embodiments, a same dummy gate stack(s) 30 may extend on both of protruding fins 24A' and protruding fins 24B'.

Next, gate spacers 38 (FIGS. 3A and 3C) are formed on the sidewalls of dummy gate stacks 30. The respective process is illustrated as process 208 in the process flow shown in FIG. 12. In accordance with some embodiments of the present disclosure, gate spacers 38 are formed of dielectric materials such as silicon carbon-oxynitride (SiCN), silicon nitride, silicon oxy-carbon-oxynitride (SiOCN), or the like, and may have a single-layer structure or a multi-layer structure including a plurality of dielectric layers. The formation processes include depositing conformal spacer layers, and then performing anisotropic etching processes to form the gate spacers 38 (and fin spacers 39). In accordance with some embodiments of the present disclosure, gate spacers 38 are multi-layer gate spacers. For example, each of gate spacers 38 may include a SiN layer, and a SiOCN layer over the SiN layer. FIGS. 3A and 3C also illustrate fin spacers 39 formed on the sidewalls of protruding fins 24'. The respective process is also illustrated as process 208 in the process flow shown in FIG. 12.

In accordance with some embodiments of the present disclosure, fin spacers 39 (including 39A, 39B, 39C, 39D, 39E, 39F, 39A', 39B', 39C', and 39D' (FIG. 3B)) are formed by the same processes for forming gate spacers 38. For example, in the process for forming gate spacers 38, the blanket dielectric layer(s) that are deposited for forming gate spacers 38, when etched, may have some portions left on the sidewalls of protruding fins 24A' and 24B', hence forming fin spacers 39. In accordance with some embodiments, the fin spacers 39 include outer fin spacers such as fin spacers 39A, 39F, 39A', and 39D' (FIG. 3B), which are on the outer sides of the outmost fins in the fin-group. The fin spacers 39 further include inner fin spacers such as fin spacer 39B, 39C, 39D, 39E, 39B', and 39C', with the inner fin spacers 39B, 39C, 39D, 39E being between fins 24A', and inner fin spacers 39B' and 39C' being between fins 24B'.

Figure 4A:
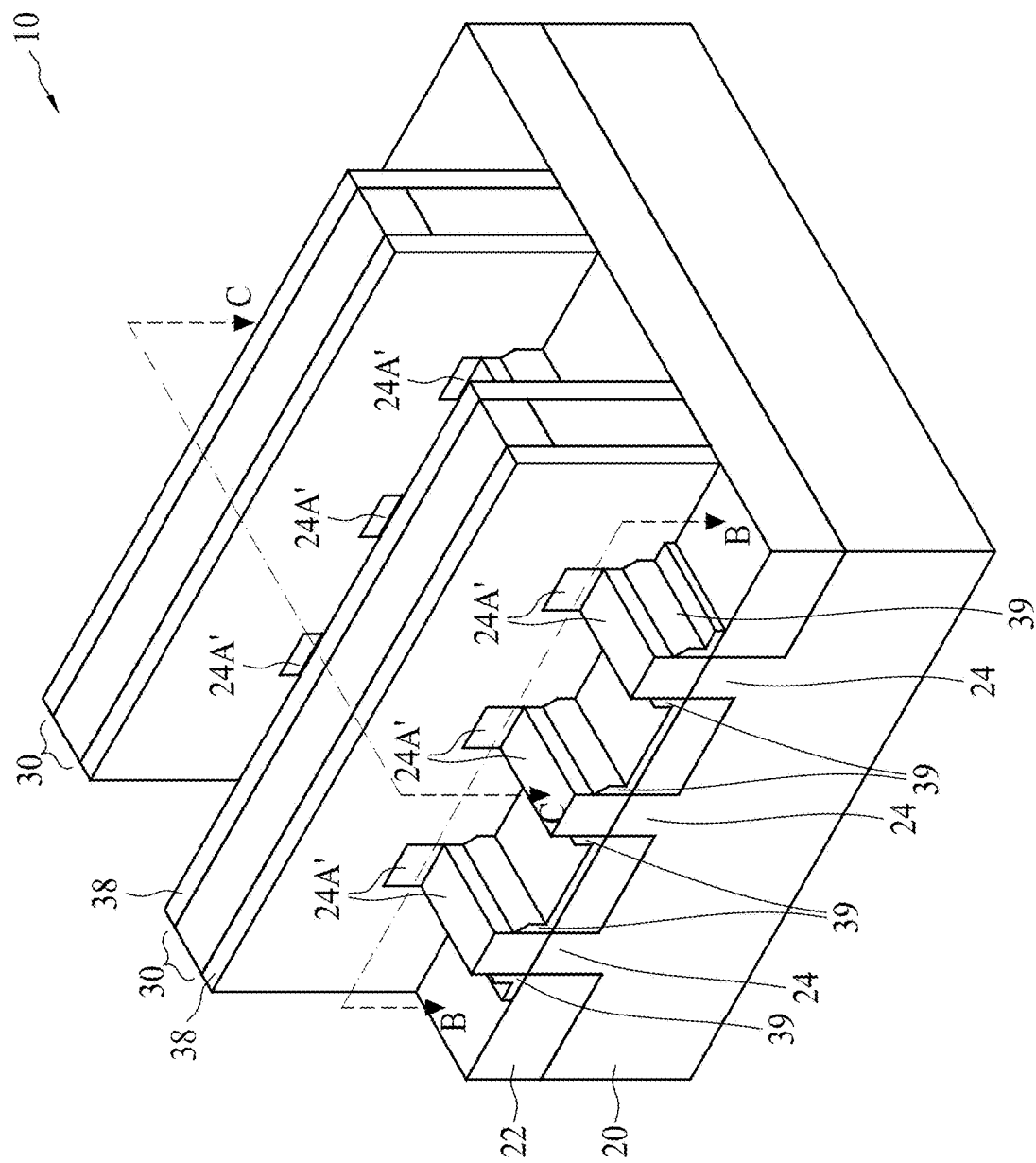
Figure 4B:
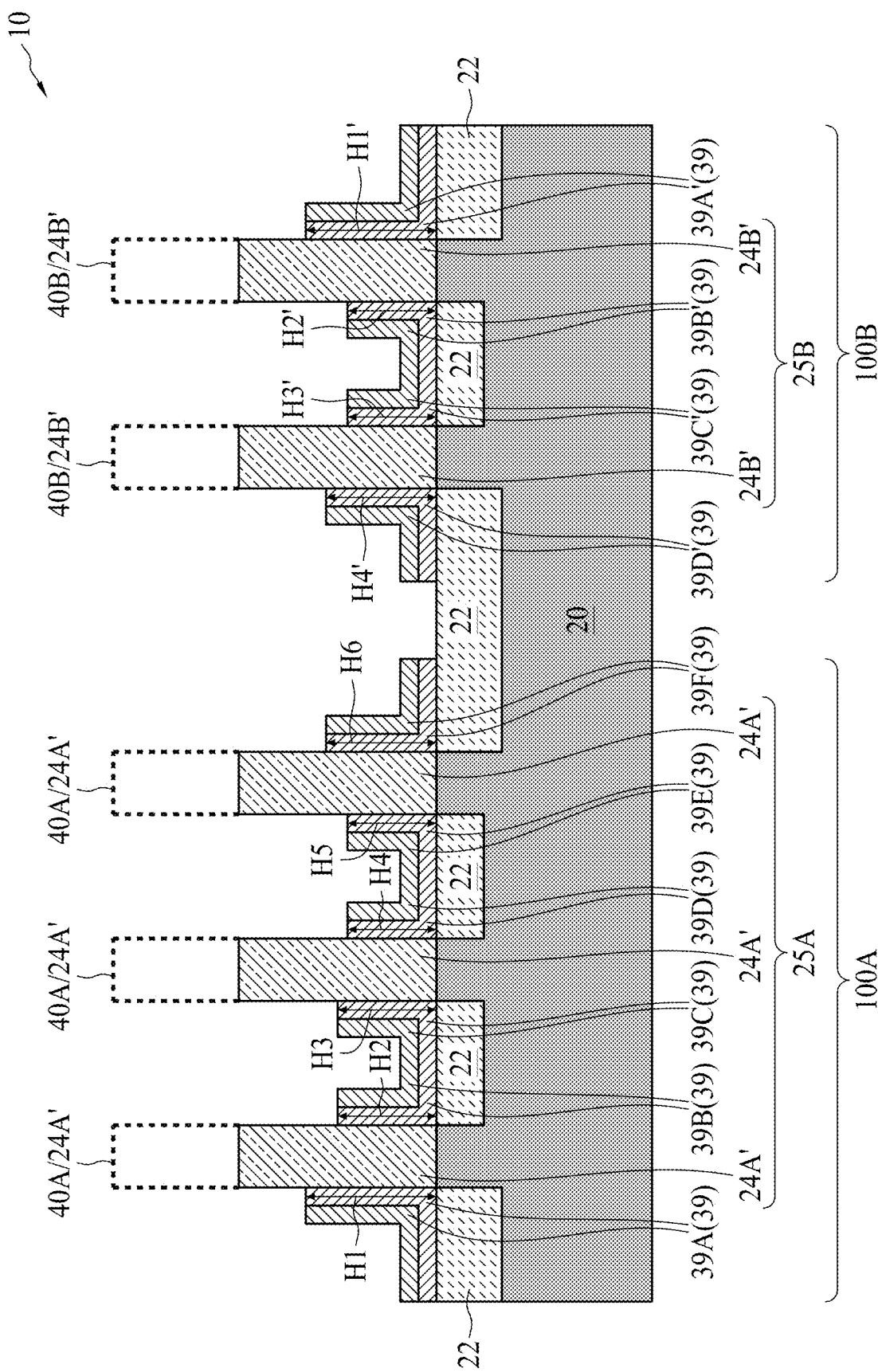
Figure 4C:
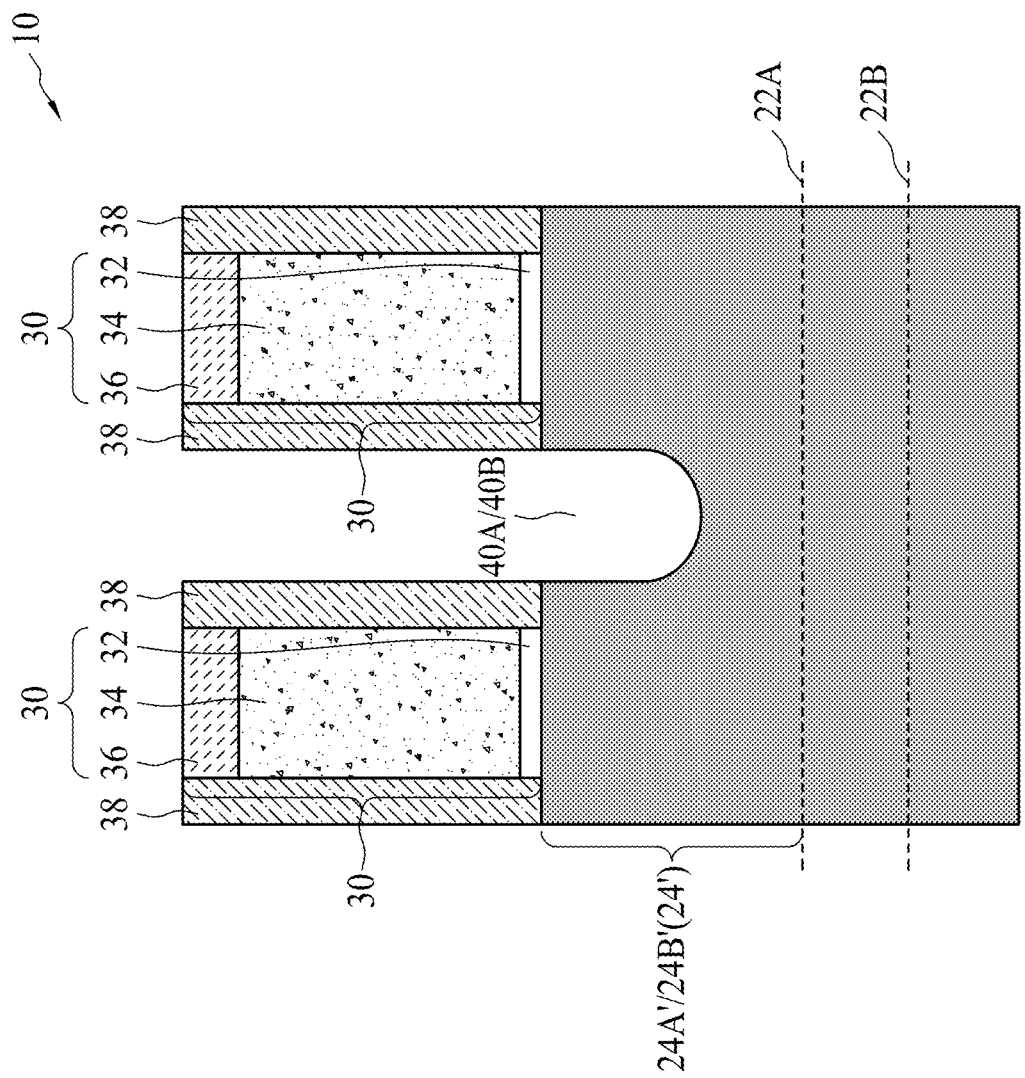

Referring to FIGS. 4A, 4B, and 4C, the portions of protruding fins 24A' and 24B' that are not covered by dummy gate stacks 30 and gate spacers 38 are recessed, hence forming recesses 40A and 40B (FIG. 4B). The respective process is illustrated as process 210 in the process flow shown in FIG. 12. FIGS. 4B and 4C illustrate the cross-sectional views obtained from reference cross-sections B-B and C-C, respectively, in FIG. 4A. The recessing may be anisotropic, and hence the portions of fins 24' directly underlying dummy gate stacks 30 and gate spacers 38 are protected, and are not etched. The top surfaces of the recessed semiconductor fins 24' may be higher than the top surfaces 22A of STI regions 22 in accordance with some embodiments, and may be higher than the remaining fin spacers 39.

In accordance with some embodiments, during the etching of protruding fins 24', fin spacers 39 are also etched, so that their heights are reduced. Fin spacers 39A, 39B, 39C, 39D, 39E, 39F have heights H1, H2, H3, H4, H5, and H6 (FIG. 4B), respectively. The etching of fin spacers 39 may be performed at the same time fins 24' are recessed, with an etching gas(es) for etching fin spacers 39 being added into the etching gas for recessing protruding fins 24'.

In accordance with some embodiments of the present disclosure, the recessing of protruding fins 24' is performed through a dry etching step. The dry etching may be performed using process gases such as $C_2F_6$, $CF_4$, $SO_2$, the mixture of HBr, $Cl_2$, and $O_2$, the mixture of HBr, $Cl_2$, $O_2$, and $CF_2$, or the like. The etching may be anisotropic. In accordance with some embodiments of the present disclosure, as shown in FIG. 4C, the sidewalls of protruding fins 24' facing recess 40 are substantially vertical, and are substantially flushed with the outer sidewalls of gate spacers 38. The sidewalls of protruding fins 24A' and 24B' facing recess 40 may be on (110) surface planes of the corresponding protruding fins 24A' and 24B'. Referring to FIG. 4B, the location of recesses 40A and 40B, which are also the removed portions of protruding fins 24', are shown using dashed lines. The dash lines also represent the protruding fins 24' that are directly underlying dummy gate stacks 30 (FIG. 4C), which are in a plane different than the illustrated plane.

In the recessing of protruding fins 24', a process gas for etching fin spacers 39 is also added for recessing fin spacers 39. In accordance with some embodiments, the process gases and process conditions for etching fin spacers 39 (when protruding fins 24' are recessed) are adjusted so that the following relationships are achieved: (H1>H6), (H1>(H2 & H3)>(H4 & H5)), and ((H6>(H2 & H3)>(H4 & H5)). Heights H2 and H3 may also be equal to or close to heights H4 and H5. Alternatively stated, the left outer fin 39A has the height H1 greater than the height H6 of right outer fin 39F, and the heights H1 and H6 of both outer fins are greater than the heights H2, H3, H3, H4 and H5 of inner fins. The heights H2 and H3 of the left inner fins may also be greater than or equal to the heights H4 and H5 of the right inner fins. The etching of the fin spacers 39 may be performed using a fluorine-containing gas such as the mixture of $CF_4$, $O_2$, and $N_2$, the mixture of $NF_3$ and $O_2$, $SF_6$, the mixture of $SF_6$ and $O_2$, or the like, and may include a gas for bombarding outer spacers 39A such as argon. The adjusted process conditions for achieving the desirable fin spacer heights include, and are not limited to, partial pressures of etching gases and the bombarding gases, the bias voltage, and/or the like. Furthermore, loading effect may be used to help to achieve the desirable heights of fins spacers. For example, the ratio S2/S1, which is the ratio of inter-group spacing S2 to inner-group spacing S1, may be adjusted to adjust the loading effect, so that heights H1, H2, H3, H4, H5, and H6 may be adjusted.

In accordance with some embodiments, after the etching of protruding fins 24', in which fin spacers 39 are also recessed, an additional etching process is performed to further etch fin spacers 39, and to adjust the heights of protruding fins 24'. In this process, protruding fins 24' are not recessed. In accordance with alternative embodiments, the additional etching process is skipped. The additional etching process (if performed) may also be performed using an anisotropic etching process using, for example, similar process gases as in the formation of fin spacers. In accordance with some embodiments, the preceding processes may not be able to achieve the relationship (H1>H6), (H1>(H2 & H3)>(H4 & H5)), and ((H6>(H2 & H3)>(H4 & H5)). For example, in the preceding formation of fin spacers 39, heights H1 may be adversely smaller than height H6. The etching process is thus performed to adjust the fin spacer heights, so that height H1 is greater than H6. Alternatively, the aforementioned relationships may have already been achieved by the preceding formation of fin spacers 39, but the ratios between fin spacer heights H1, H2, H3, H4, H5, and H6 are not satisfactory. Accordingly, the additional etching process may be performed to adjust the ratios to desirable values.

In above-discussed processes, the height H1', H2', H3', and H4' of the respective fin spacers 39A', 39B', 39C' and 39D' may also be adjusted, so that height H1' is greater than H4', and both of heights H1' and H4' are greater than heights H2' and H3'.

Figure 5:
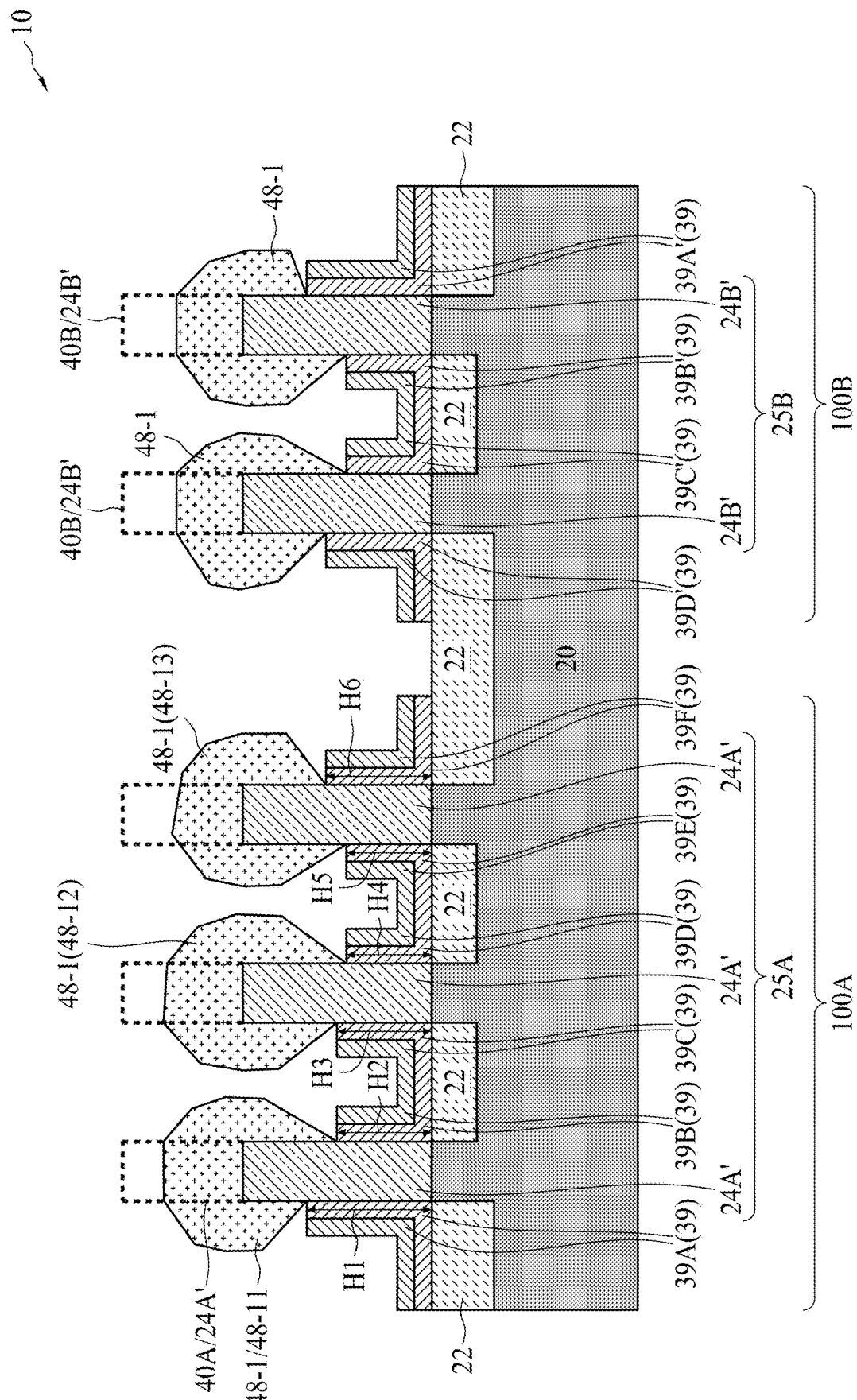

Referring to FIG. 5, epitaxy layers 48-1 (which are also referred to as epitaxy layers L1, and include 48-11, 48-12, and 48-13) are deposited through an epitaxy process. The respective process is illustrated as process 212 in the process flow shown in FIG. 12. In accordance with some embodiments, the deposition is performed through a non-conformal deposition process, so that the bottom portion (FIG. 11C) of first layer 48-1 is thicker than the sidewall portions. The deposition may be performed using RPCVD, PECVD, or the like. In accordance with some embodiments, epitaxy layers 48-1 are formed of or comprise SiGeB. The process gas for depositing epitaxy layer 48-1 may include a silicon-containing gas such as silane, disilane ($Si_2H_6$) dichlorosilane (DCS), or the like, a germanium-containing gas such as germane ($GeH_4$), digermane ($Ge_2H_6$), or the like, and a dopant-containing process gas such as $B_2H_6$ or the like, depending on the desirable composition of epitaxy layer 48-1. In addition, an etching gas such as HCl may be added to achieve selective deposition on semiconductor, but not on dielectric. Epitaxy layer 48-1 may have a boron concentration in the range between about $5 \times 10^{19}/cm^3$ and about $8 \times 10^{20}/cm^3$. The germanium atomic percentage may be in the range between about 15 percent and about 45 percent. The germanium atomic percentage may be gradient, with the higher portions having higher germanium atomic percentages than the respective lower portions.

As shown in FIG. 5, epitaxy layers 48-1 expand laterally and grow to each other. On the other hand, the epitaxy layers 48-1 that are grown from different protruding fins 24A' and 24B' are still separated from each other and not merged. The top ends of epitaxy layers 48-1 are controlled to be lower than the top surfaces of the original un-recessed protruding fins 24', for example, by a difference in the range between about 5 nm and about 10 nm. In accordance with some embodiments, due to the aforementioned relationship between heights H1 through H6, the top end of epitaxy layer 48-11 is higher than the top end of epitaxy layer 48-13. Furthermore, the top end of epitaxy layer 48-11 may be level with or higher than the top end of epitaxy layer 48-12.

Figure 6:
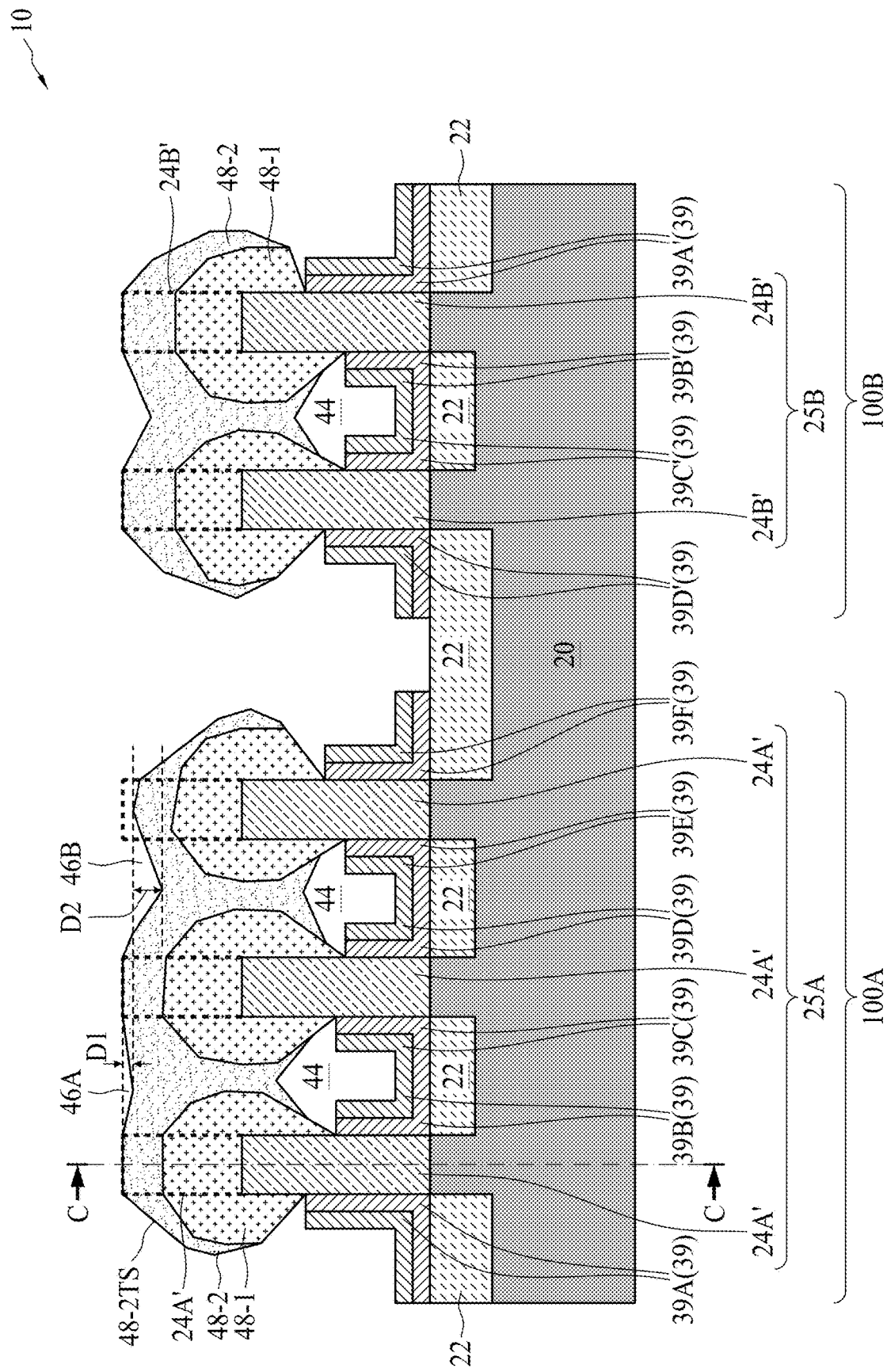

Referring to FIG. 6, epitaxy layers 48-2 (which is also referred to as epitaxy layer L2) are deposited. The respective process is illustrated as process 214 in the process flow shown in FIG. 12. The deposition process may be performed using RPCVD, PECVD, or the like. In accordance with some embodiments, epitaxy layer 48-2 includes SiGeB, with the boron having a second boron concentration higher than the boron concentration in epitaxy layer 48-1. For example, the boron concentration in epitaxy layer 48-2 may be in the range between about $5 \times 10^{20}/cm^3$ and about $3 \times 10^{21}/cm^3$ in accordance with some embodiments. Furthermore, the germanium atomic percentage in epitaxy layer 48-2 is higher than the germanium atomic percentage in epitaxy layers 48-1. For example, the germanium atomic percentage in epitaxy layer 48-2 may be in the range between about 40 percent and about 65 percent in accordance with some embodiments. The process gas for forming epitaxy layers 48-2 may be similar to the process gas in the formation of epitaxy layers 48-1, except the flow rates of the process gases for forming epitaxy layer 48-2 may be different from the flow rates of the corresponding process gases in the formation of epitaxy layers 48-1.

After the epitaxy process to deposit epitaxy layers 48-2, an etching (back) process is performed. In accordance with some embodiments of the present disclosure, the etching-back process is isotropic. In accordance with some embodiments, the etching process is performed using an etching gas such as HCl, and a carrier gas(es) such as $H_2$ and/or $N_2$. In addition, a germanium-containing gas such as germane ($GeH_4$) may be added in the etching gas. A silicon-containing gas such as silane ($SiH_4$) may be, or may not be added in the etching gas. The addition of the germanium-containing gas (and the possible silicon-containing gas) results in a deposition effect, which occurs concurrently as the etching effect. The etching rate, however, is greater than the deposition rate, so that the net effect is the etching-back of epitaxy layer 48-2. The addition of the germanium and silicon containing gas reduces the net etching rate, so that when the surface profile of epitaxy layers 48-2 is re-shaped, the thickness of epitaxy layer 48-2 is not reduced significantly. The deposition and the etching are optimized so that epitaxy layers 48-2 have a desirable thickness. Also, as shown in FIG. 6, the top surfaces 48-2TS of epitaxy layer 48-2 are re-shaped so that (111) facets are generated, especially on the portion of epitaxy layer 48-2 grown from the rightmost protruding fin in fin-group 25A and the leftmost protruding fin in fin-group 25B.

The top ends of epitaxy layer 48-2 are controlled to be level with or at least close to (for example, with a difference smaller than about 5 nm or about 3 nm) the top ends of the original un-recessed protruding fins 24A'. FIG. 11C illustrates the cross-sectional views of the reference cross-sections C-C in FIG. 6, which shows that the opposite ends of epitaxy layer 48-2 are level with the top surfaces of protruding fins 24A', while the middle portion of the top surface of epitaxy layer 48-2 may be level with or slightly lower than the top surfaces of the corresponding protruding fins 24A' and 24B'.

Referring back to FIG. 6, the epitaxy layers 48-2 grown from neighboring recesses are merged, with air gap 44 being sealed under epitaxy layer 48-2. The top surface of the merged epitaxy layer 48-2 may have a non-planar profile (also referred to as having a wavy shape), with the middle portion that is laterally between neighboring fins 24A' being lower than the portions on its opposite sides. The non-recessed portions may be directly over protruding fins 24A'. Due to the difference in fin spacer heights H1, H2, H3, H4, H5, and H6, there are recesses 46A and 46B formed. Recess 46A is laterally between (and is higher than) the left two protruding fins 24A', while recess 46B is laterally between (and is higher than) the right two protruding fins 24A'. In accordance with some embodiments, recessing depth D1 of recess 46A is smaller than recessing depth D2 of recess 46B, for example, with ratio D2/D1 being greater than about 1.5, greater than about 2, or in the range between about 1.5 and about 5.

Figure 7:
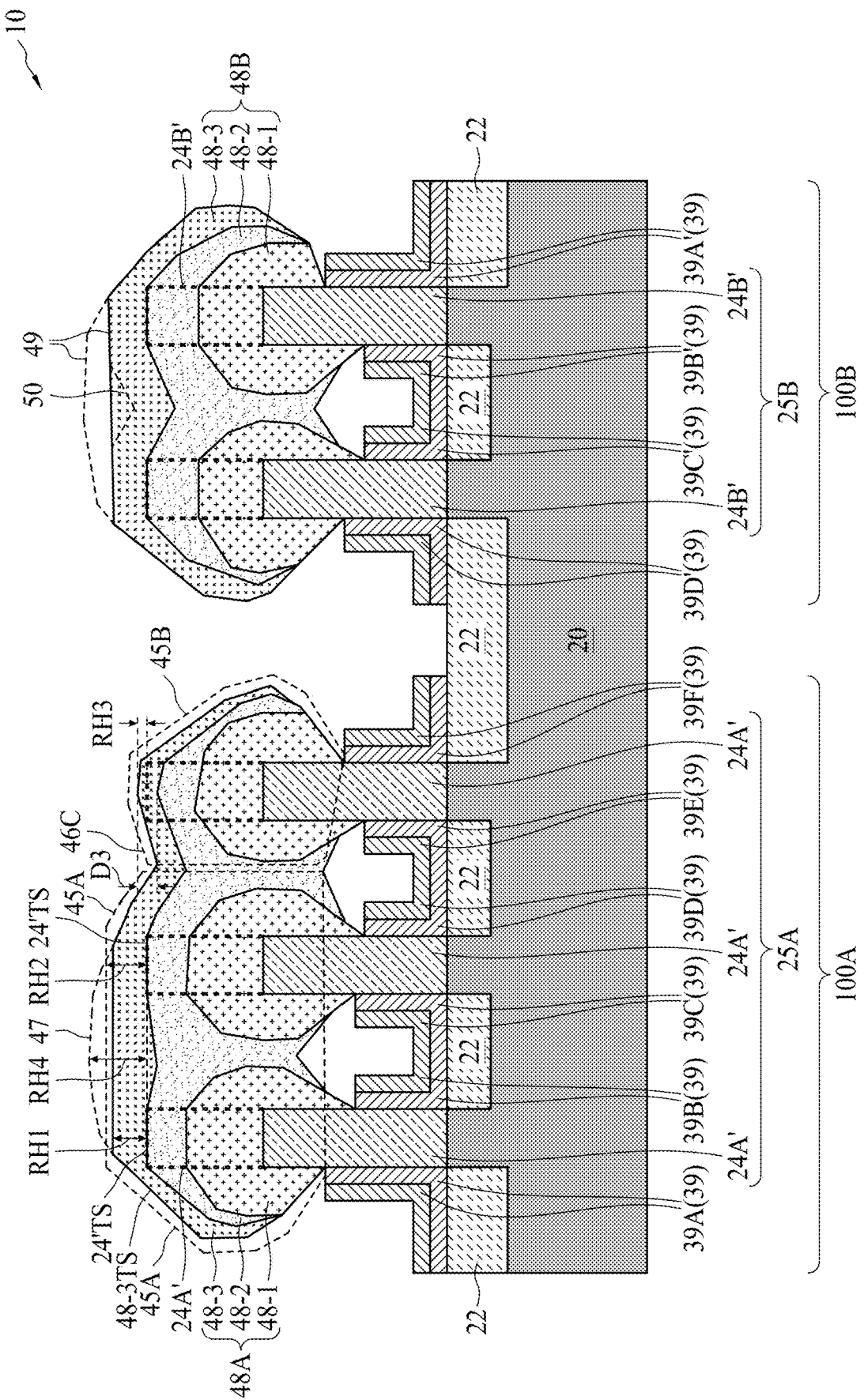

FIG. 7 illustrates the epitaxy process for depositing epitaxy layer 48-3 (which is also referred to as epitaxy layer L3 or a capping layer). The respective process is illustrated as process 216 in the process flow shown in FIG. 12. The deposition process may be performed using RPCVD, PECVD, or the like. In accordance with some embodiments, epitaxy layer 48-3 includes SiGeB. The boron concentration in epitaxy regions 48-3 may be in the range between about $5 \times 10^{20}/cm^3$ and about $1 \times 10^{21}/cm^3$. Furthermore, the germanium atomic percentage in epitaxy layer 48-3 may be greater than, equal to, or lower than the germanium atomic percentage in epitaxy layers 48-2. For example, the germanium atomic percentage in epitaxy layers 48-3 may be in the range between about 45 percent and about 55 percent in accordance with some embodiments.

After the epitaxy process to deposit epitaxy layers 48-3, an etching (back) process is performed. In accordance with some embodiments of the present disclosure, the etching-back process is isotropic. In accordance with some embodiments, the etching process is performed using an etching gas such as HCl, and a carrier gas(es) such as $H_2$ and/or $N_2$. In addition, a germanium-containing gas such as germane (GeH$_4$) may be added in the etching gas. A silicon-containing gas such as silane (SiH$_4$) may be, or may not be, added in the etching gas. The addition of the germanium-containing gas results in a deposition effect, which occurs concurrently as the etching effect. The etching rate, however, is greater than the deposition rate, so that the net effect is the etching-back of epitaxy layer 48-3. The addition of the germanium-containing gas reduces the net etching rate, so that when the surface profile of epitaxy layers 48-3 is re-shaped, the thickness of epitaxy layer 48-3 is not reduced significantly. The deposition and the etching are optimized so that epitaxy layers 48-3 have a desirable thickness. Also, as shown in FIG. 7, the top surfaces and sidewalls surfaces of epitaxy layer 48-3 are re-shaped as having more (111) facets generated, especially the portion of epitaxy layer 48-3 grown from the rightmost protruding fin in fin-group 25A and the leftmost protruding fin in fin-group 25B. Furthermore, with the more and better (111) facets being formed, sharper corners are formed. Throughout the description, epitaxy layers 48-1, 48-2, and 48-3 are collectively and individually referred to as epitaxy layers (regions) 48, which are collectively referred to as source/drain regions 48A and 48B hereinafter.

In accordance with some embodiments, epitaxy region 48A has raised portions that are higher than the top surface 24'TS of protruding fins 24A'. the raise height RH1 directly over the leftmost protruding fin 24A' is greater than the raise height RH3 directly over the rightmost protruding fin 24A', and may be equal to or slightly greater than (for example, with a difference smaller than about 2 nm) raise height RH2.

Epitaxy layer 48-3 has top surface 48-3TS, which is also the top surface of source/drain region 48. In accordance with some embodiments, the portion 45A of the source/drain region 48 formed based on the left two protruding fins 24A' have a cone shape, and the top surface of portion 45A is generally flat, and may have a convex top surface. For example, from the right edge of the first protruding fin (counted from left) to the right edge of the second protruding fin 24' (counted from left), the top surface of epitaxy layer 48-3 may be flat. Alternatively, this portion of the top surface may be rounded (as represented by dashed line 47) and has a convex shape, with the highest point being between (and may be in the middle of) the first protruding fin and the second protruding fin. Alternatively stated, the raise height RH4 is greater than raise heights RH1, RH2, and RH3. On the other hand, the top surface of the right portion of the source/drain region 48 formed based on the right two protruding fins 24A', which right portion include portion 45B and the right part of portion 45A, is wavy (concave), with a significant recess 46C formed. In accordance with some embodiments, the depth D3 of the recess 46C is greater than about 3 nm, and may be in the range between about 3 nm and about 15 nm. Accordingly, overall, the left side of the top surface of source/drain region 48 is more flat and higher than the right side, wherein the left side is the side farther away from the neighboring fin-group 25B, while the right side is the side closer to the neighboring fin-group 25B.

The epitaxy region 48B may include layers 48-1, 48-2, and 48-3. In accordance with some embodiments, epitaxy region 48B is of p-type, and may be formed in the same process for forming epitaxy region 48A. In accordance with alternative embodiments, epitaxy region 48B is of n-type and belongs to an n-type FinFET, and hence is formed in a different process than the formation of epitaxy region 48A. Epitaxy region 48B may have a cone shape (with the top surface being convex), for example, when epitaxy region 48B is of p-type. Alternatively, epitaxy region 48B may have a wavy top surface, as indicated by dashed line 50, which may occur when epitaxy region 48B is of n-type. In accordance with some embodiments, the top surface of epitaxy region 48B may be flat, or may slightly tilted, with the portion closer to fin-group 25A being lower than the portion farther away from fin-group 25A.

Figure 8A:
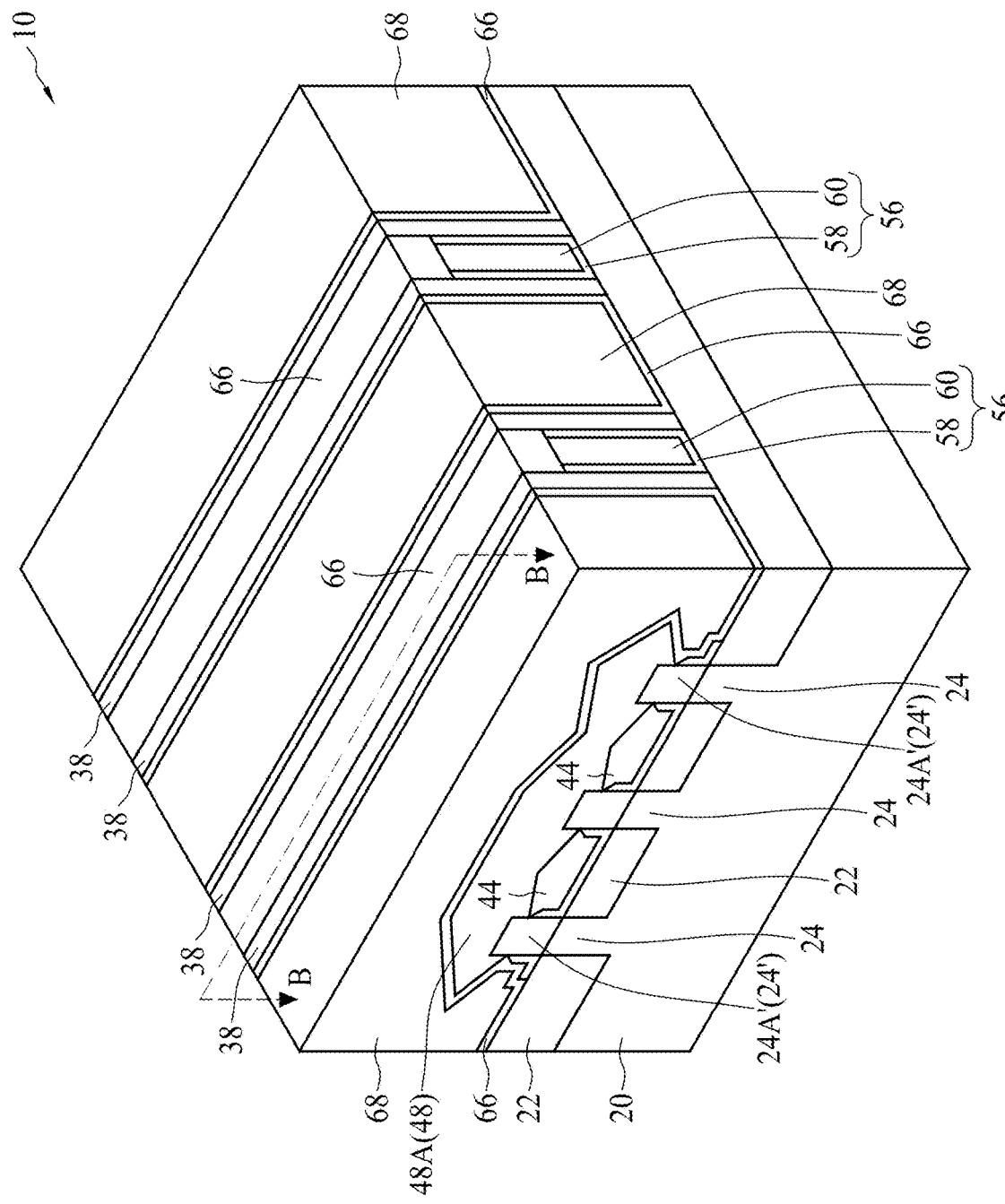
Figure 8B:
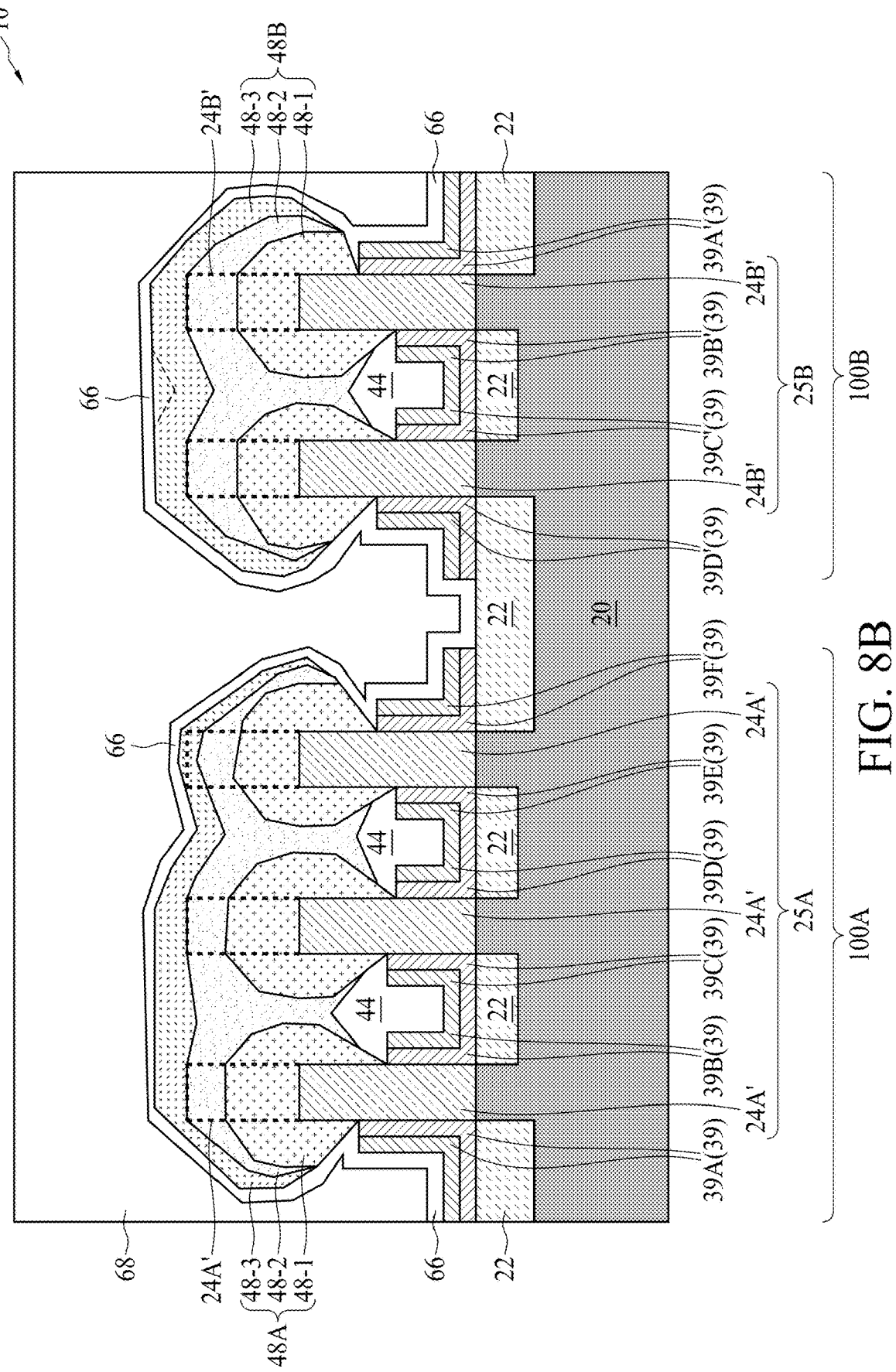

Referring to FIGS. 8A and 8B, Contact etch stop layer (CESL) 66 and Inter-Layer Dielectric (ILD) 68 are formed over epitaxy regions 48A and 48B. The respective process is illustrated as process 218 in the process flow shown in FIG. 12. A planarization such as Chemical Mechanical Polish (CMP) process or a mechanical grinding process is performed to remove excess portions of CESL 66 and ILD 68, until dummy gate stacks 30 (FIGS. 4A and 4C) are exposed.

The dummy gate stacks 30 (FIGS. 4A and 4C) are then removed in an etching process, and are replaced with replacement gate stacks 56, as shown in FIG. 8A. The respective process is illustrated as processes 220 and 222 in the process flow shown in FIG. 12. Replacement gate stacks 56 include gate dielectrics 58, which further include interfacial layers on the top surfaces and sidewalls of protruding fins 24', and high-k dielectrics over the interfacial layers. Replacement gate stacks 56 further include gate electrodes 60 over gate dielectrics 58. After the formation of replacement gate stacks 56, replacement gate stacks 56 are recessed to form trenches between gate spacers 38. A dielectric material such as silicon nitride, silicon oxynitride, or the like, is filled into the resulting trenches to form dielectric hard masks 62. The respective process is illustrated as process 224 in the process flow shown in FIG. 12.

Figure 9:
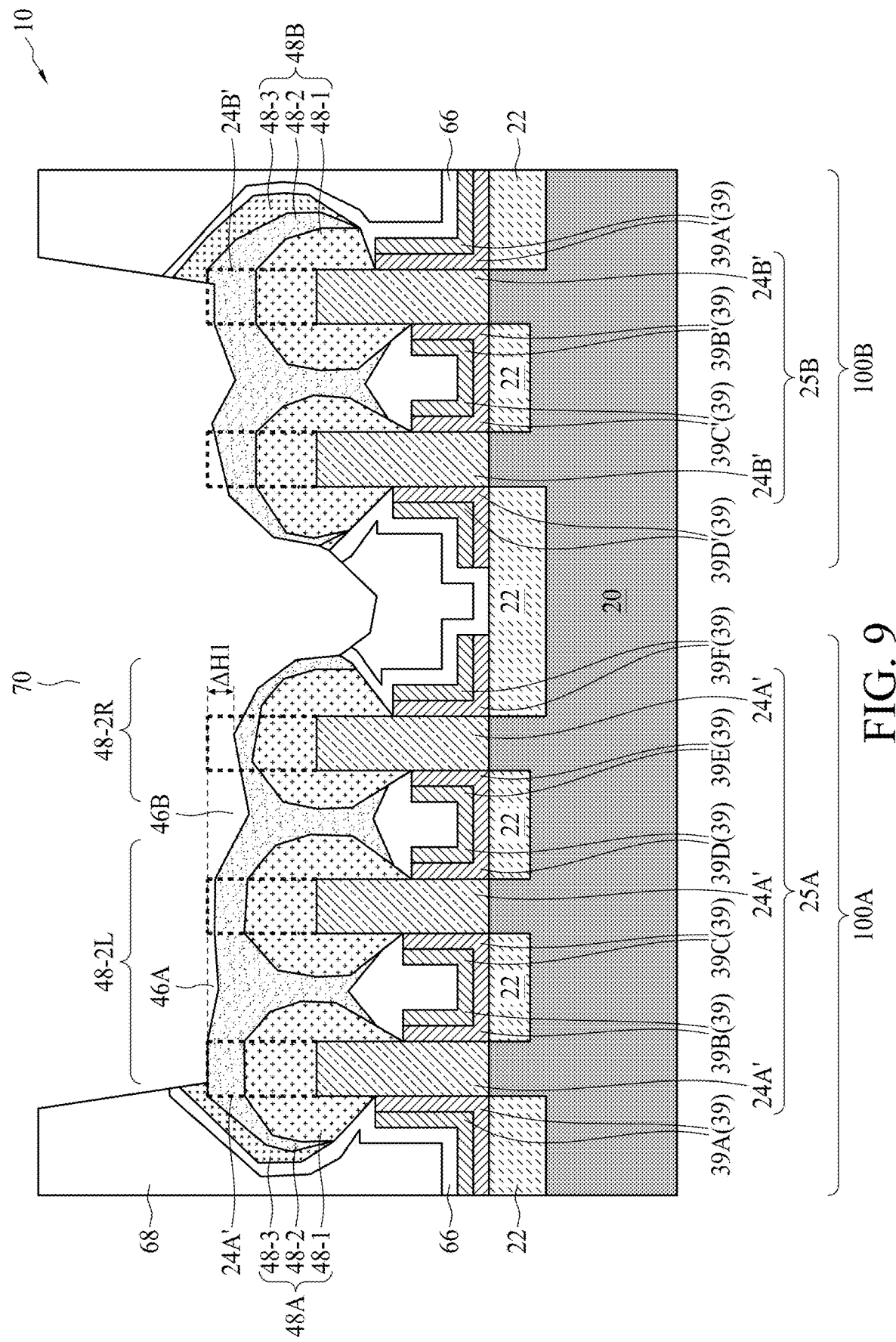

Next, referring to FIG. 9, ILD 68 and CESL 66 are etched to form source/drain contact opening 70. The respective process is illustrated as process 226 in the process flow shown in FIG. 12. Epitaxy layers 48-3 are also etched-through, and the top surfaces of epitaxy layers 48-2 are exposed. The opening 70 may extend into epitaxy regions 48A and 48B for a depth in the range between about 5 nm and about 10 nm. The etching may be controlled to stop on epitaxy layers 48-2, with a small over-etching, for example, smaller than about 2 nm on epitaxy layers 48-2. The exposed top surface of epitaxy layers 48-2 are wavy, and the recesses 46A and 46B may be exposed, so that the exposed top surface of epitaxy layers 48-2 include portions having V-shapes in the cross-sectional view. It is appreciated that although the left portion of epitaxy region is no longer non-wavy, and also has the wavy top surface, the overall structure including CESL 66 and ILD 68 will prevent the bending of protruding fins at this stage of the manufacturing process.

Since the flat portions of epitaxy layers 48-2 are etched slower than the portions having corners, the right portion 48-2R, which have more corners than the left portions, are etched more than portions 48-2L, which have a flatter surface. Accordingly, the top end of portion 48-2R is lower than the top end of portion 48-2L, for example, with their top surfaces having a height difference ΔH1 greater than about 3 nm, and may be in the range between about 2 nm and about 10 nm. Overall, the side of epitaxy region 48A facing toward epitaxy region 48B is lower than the side facing away from epitaxy region 48B. The exposed top surface of epitaxy layers 48-2 has recesses (concaves) 46A and 46B.

Figure 10:
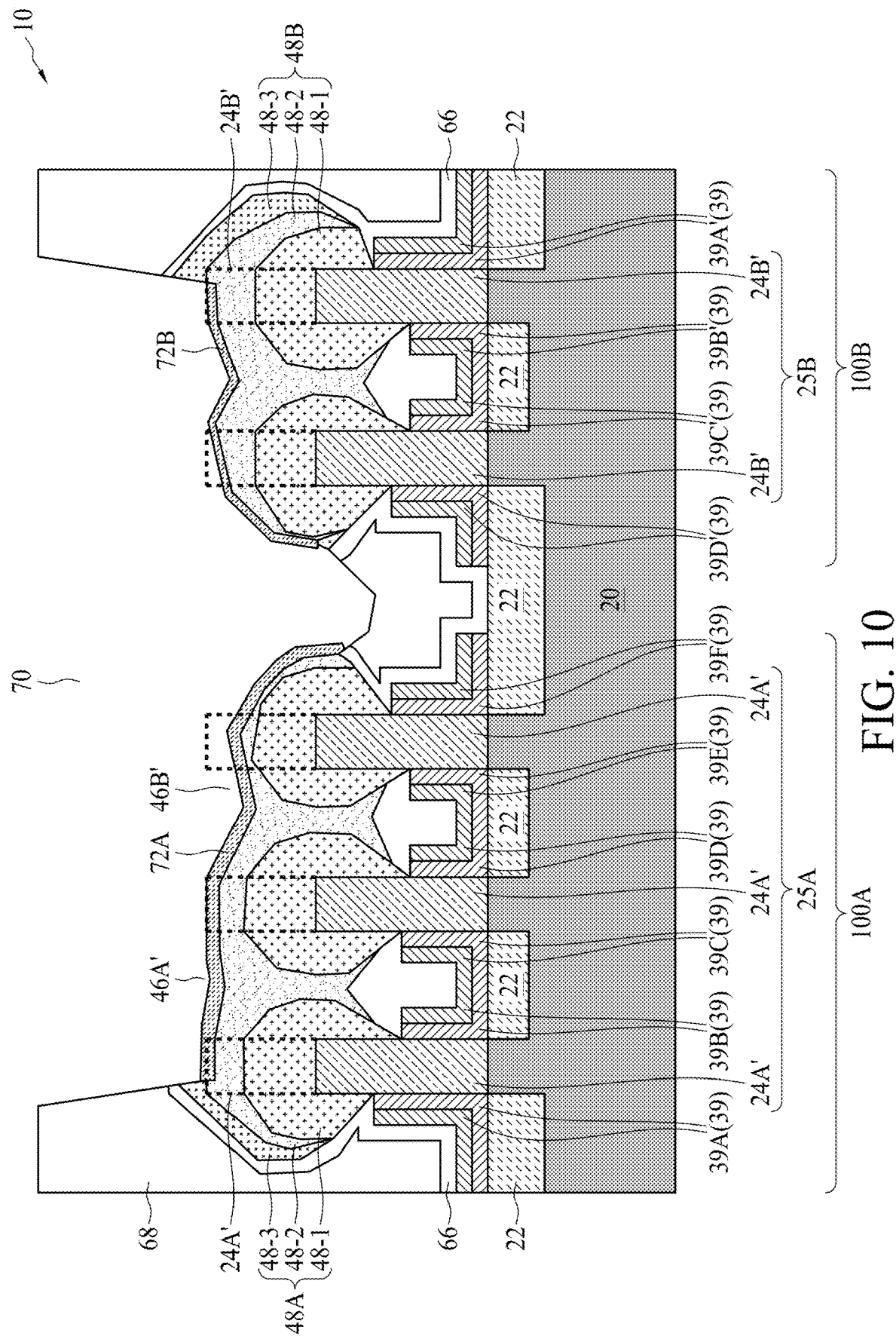

Next, as shown in FIG. 10, source/drain silicide regions 72A and 72B are formed. The respective process is illustrated as process 228 in the process flow shown in FIG. 12. In accordance with some embodiments of the present disclosure, the formation of the source/drain silicide regions 72A and 72B includes depositing a metal layer such as a titanium layer, a cobalt layer, or the like, which extends into opening 70, and then performing an annealing process so that the bottom portions of the metal layer react with epitaxy layers 48-2 to form the silicide regions 72A and 72B. The remaining un-reacted metal layer may be removed. The exposed top surfaces of source/drain silicide regions 72A and 72B have recesses (concaves) including recesses 46A' and 46B'.

Figure 11A:
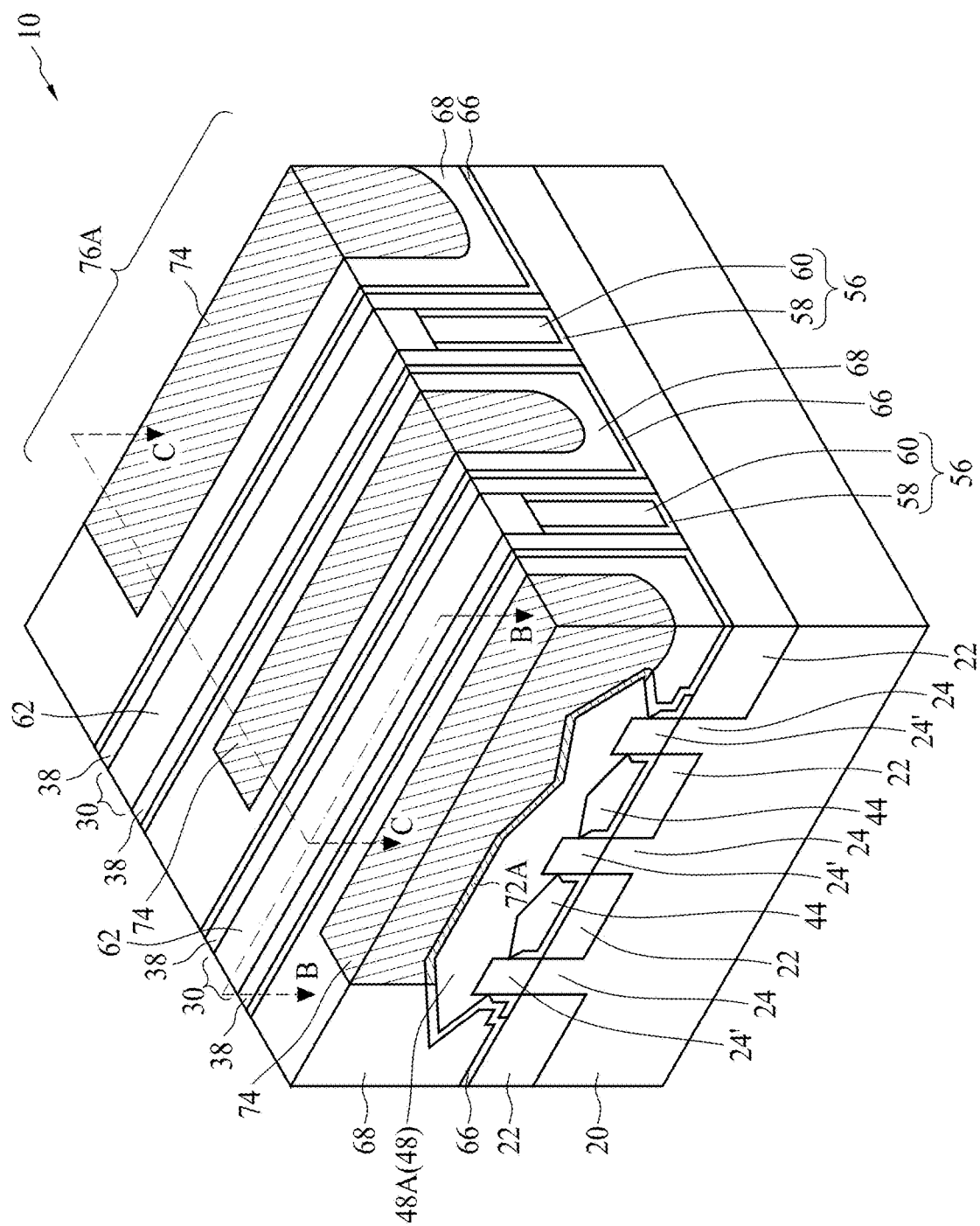
Figure 11B:
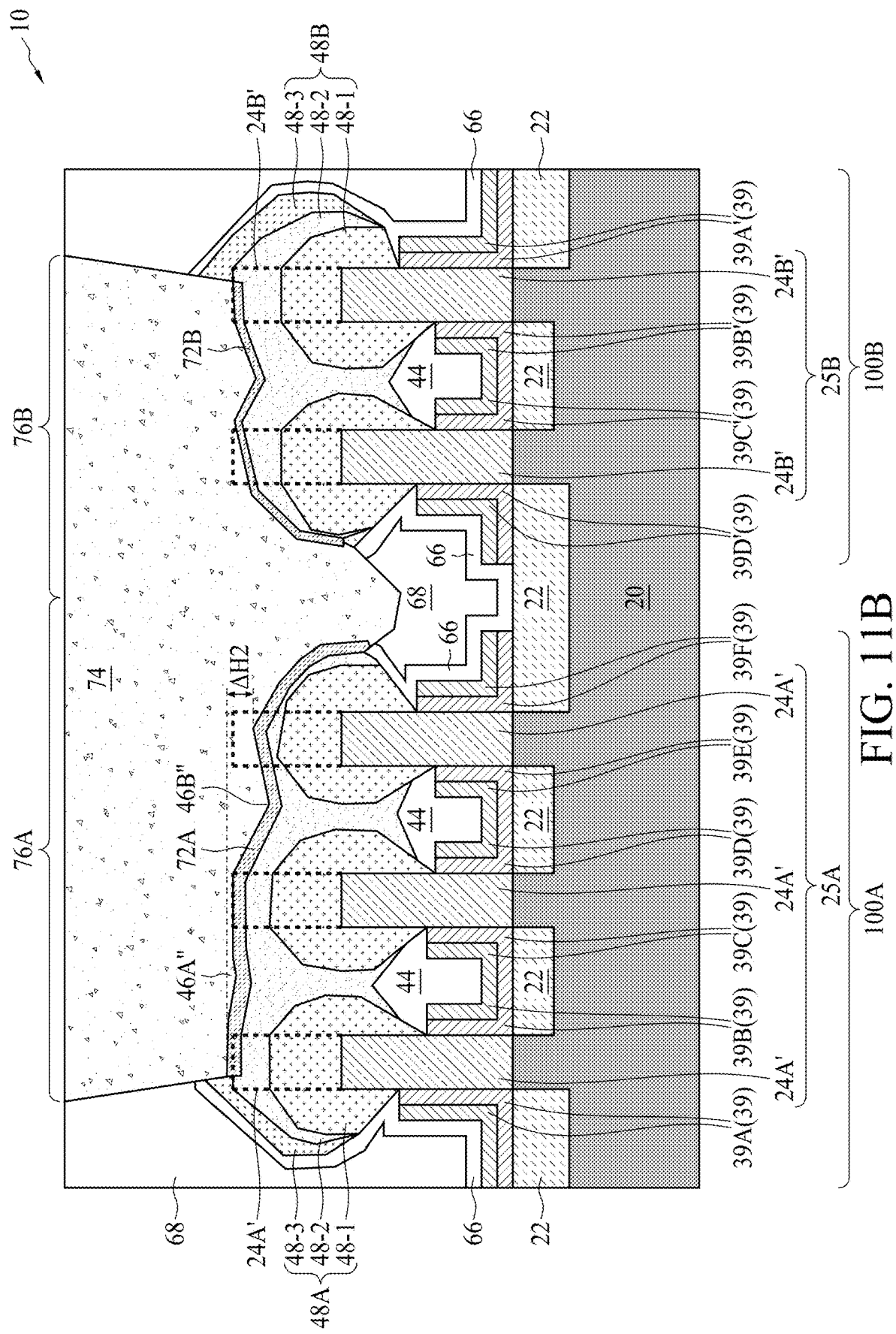
Figure 11C:
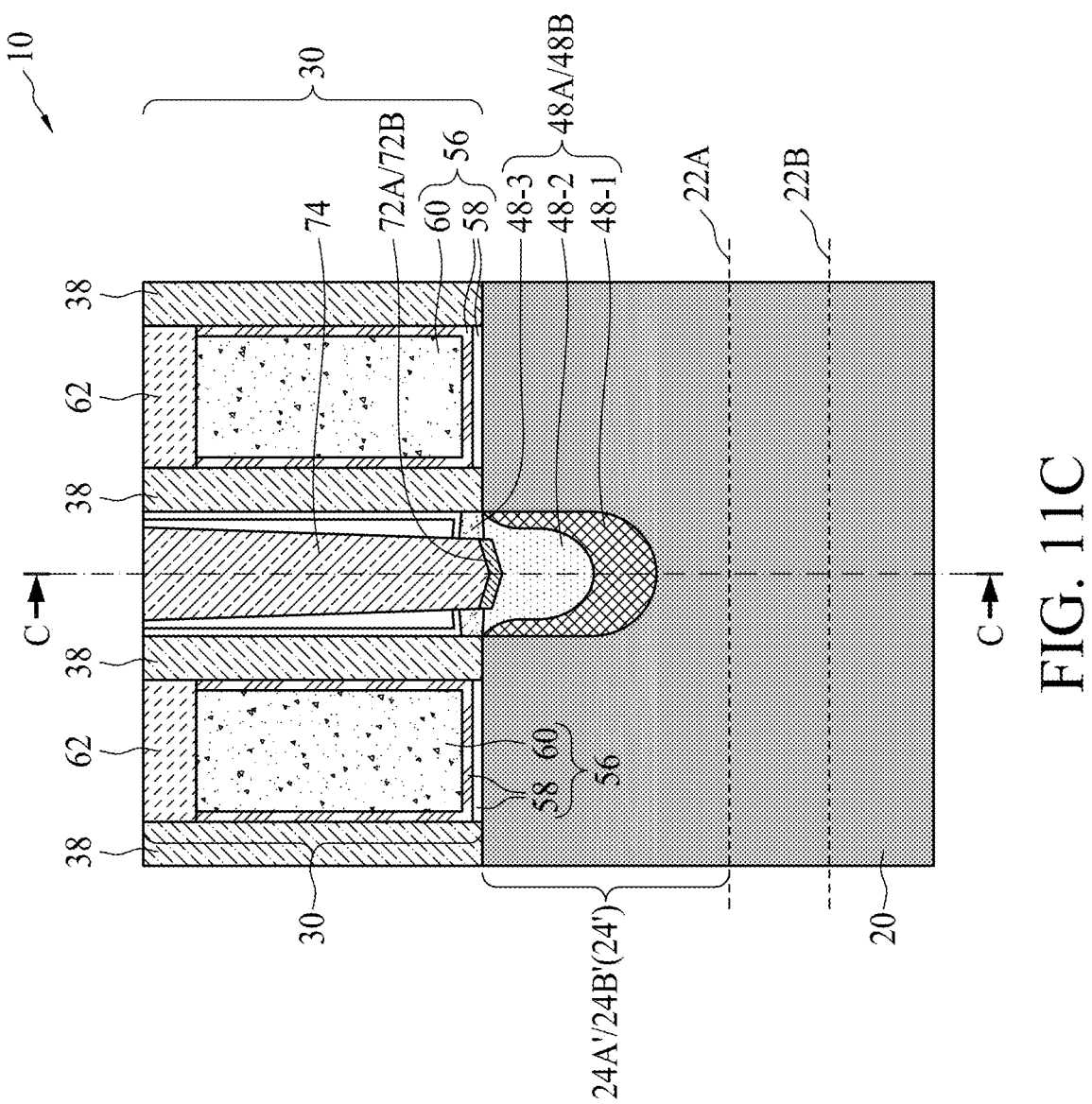
Figure 12:
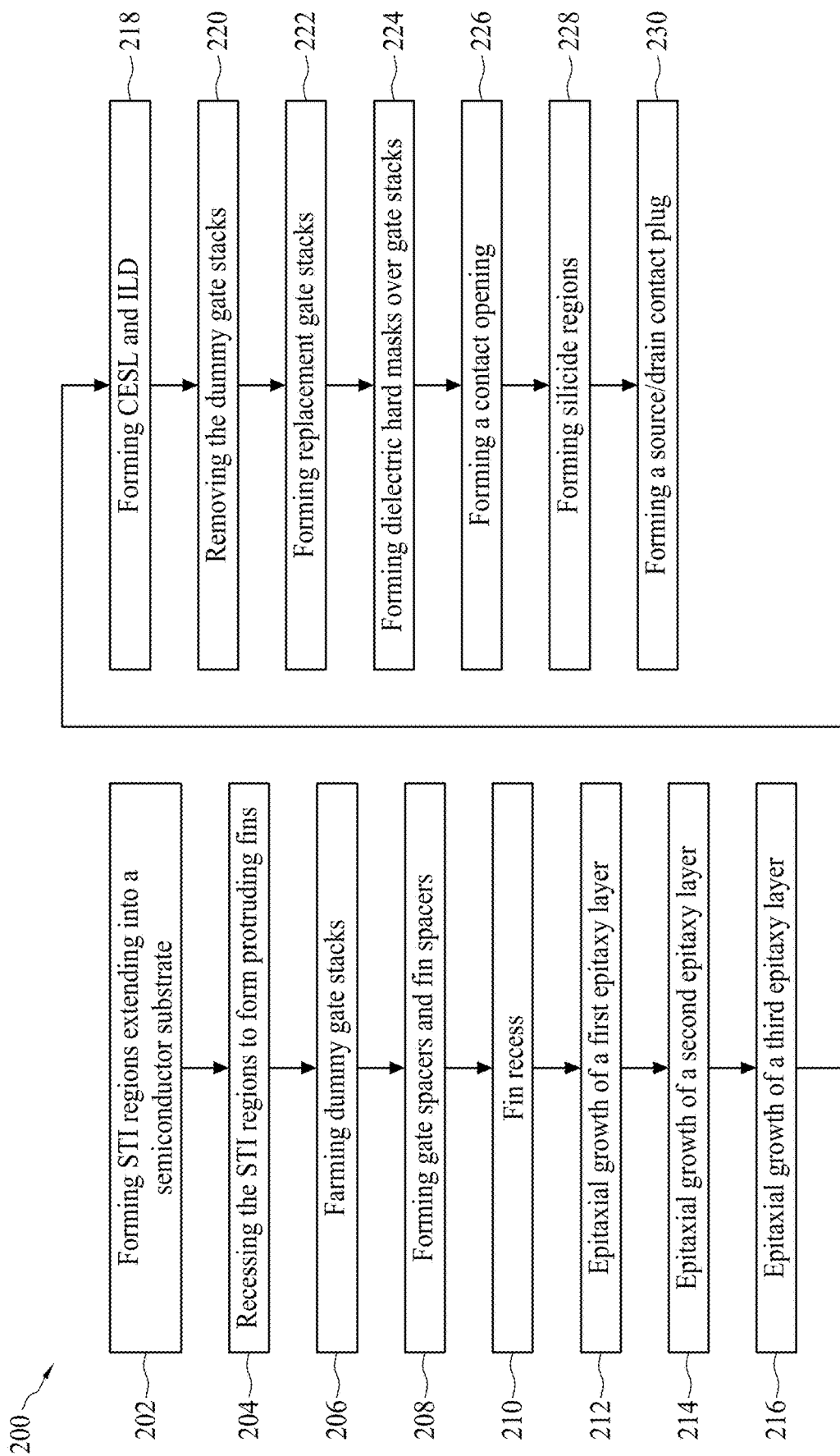
FIG. 12 illustrates a process flow for forming an n-type FinFET and a p-type FinFET in accordance with some embodiments.

FIGS. 11A, 11B, and 11C illustrate the formation of contact plug(s) 74. The respective process is illustrated as process 230 in the process flow shown in FIG. 12. As shown in FIG. 11B, source/drain contact plug 74 is formed filling opening 70, and electrically interconnects source/drain silicide regions 72A and 72B. FinFET 76A and FinFET 76B (FIG. 11B) are thus formed, and the source/drain regions 48A and 48B are electrically interconnected by contact plug 74. FIG. 11B illustrates the reference cross-section B-B in FIG. 11A, and FIG. 11C illustrates the reference cross-section C-C in FIG. 11A. As shown in FIG. 11B, the top surface of epitaxy regions 48A is asymmetric and tilted, with the inner portions closer to epitaxy region 48B being lower than the outer portions farther away from epitaxy region 48B. Silicide regions 72A and 72B are accordingly tilted. In accordance with some embodiments, the top surface of the inner portions of silicide region 72A is lower than the respective outer portions by height difference ΔH2, which may be greater than about 2 nm, and may be in the range between about 2 nm and about 10 nm. Silicide region 72A may have recesses (concaves) 46A" and 46B". Also, silicide regions 72A and 72B extend on the sidewall of epitaxy regions 48A and 48B, so that the contact areas between silicide regions 72A and 72B and the respective epitaxy regions 48A and 48B are increased, and contact resistance reduced.

The embodiments of the present disclosure have some advantageous features. By forming a first portion of the epitaxy region as being non-wavy (with cone shape), the bending of all semiconductor fins in a fin-group, based on which the epitaxy region is formed, may be reduced since the non-wavy part acts as an anchor to prevent the rest of semiconductor fins from being bent. By forming a second portion of the epitaxy region as having a wavy top surface, the contact area is increased. In addition, with the wavy shape, the epitaxy regions have more sharp corners, which are etched in the formation of source/drain silicide region and contact plug, so that the corresponding silicide region extends on the sidewall of the epitaxy region, and the contact resistance is further reduced.

In accordance with some embodiments of the present disclosure, a method includes recessing isolation regions on opposing sides of a first semiconductor strip, a second semiconductor strip, and a third semiconductor strip to form a first semiconductor fin, a second semiconductor fin, and a third semiconductor fin; forming a gate stack on the first semiconductor fin, the second semiconductor fin, and the third semiconductor fin; forming gate spacers on sidewalls of the gate stack; forming fin spacers on sidewalls of the first semiconductor strip, the second semiconductor strip, and the third semiconductor strip; performing a recessing process to recess the first semiconductor strip, the second semiconductor strip, and the third semiconductor strip to form a first recess, a second recess, and a third recess, respectively; and performing an epitaxy process to form an epitaxy region starting from the first recess, the second recess, and the third recess, wherein the epitaxy region comprises a top surface comprising a convex portion higher than, and laterally between, the first semiconductor fin and the second semiconductor fin; and a concave portion higher than, and laterally between, the second semiconductor fin and the third semiconductor fin. In an embodiment, the fin spacers further comprise a first outer fin spacer having a first height; a second outer fin spacer having a second height smaller than the first height; and inner spacers between the first outer fin spacer and the second outer fin spacer, wherein the inner spacers have heights smaller than the first height and the second height. In an embodiment, the fin spacers are etched simultaneously during the recessing process, and the method further comprises, after the recessing process, further recessing the fin spacers. In an embodiment, the first semiconductor fin, the second semiconductor fin, and the third semiconductor fin form a first fin-group, wherein the first fin-group is neighboring a second fin-group, and the second outer fin spacer faces toward the second fin-group, and the first outer fin spacer faces away from the second fin-group. In an embodiment, after the first semiconductor fin, the second semiconductor fin, and the third semiconductor fin are recessed, top surfaces of the first semiconductor fin, the second semiconductor fin, and the third semiconductor fin are higher than top ends of the fin spacers. In an embodiment, the epitaxy region comprises a first epitaxy layer, a second epitaxy layer, and a third epitaxy layer, wherein the third epitaxy layer comprises a first part having the convex portion of the top surface, and a second part having the concave portion of the top surface, and wherein the method further comprises etching-through the first part of the third epitaxy layer to reveal a concave top surface of the second epitaxy layer. In an embodiment, the method further includes forming a silicide region on the second epitaxy layer, wherein the silicide region comprises a first portion directly on the concave top surface of the second epitaxy layer; and a second portion directly over the third semiconductor fin, wherein the first portion of the silicide region is higher than the second portion of the silicide region. In an embodiment, the third epitaxy layer comprises a lower boron concentration than the second epitaxy layer. In an embodiment, the epitaxy process comprises depositing silicon germanium boron.

In accordance with some embodiments of the present disclosure, a method includes forming a first fin-group and a second fin-group, wherein the first fin-group comprises a plurality of semiconductor fins with inner-group spacings, wherein the first fin-group and the second fin-group have an inter-group spacing greater than the inner-group spacings, and wherein the plurality of semiconductor fins comprises a first semiconductor fin, with the first semiconductor fin being farthest from the second fin-group among the first fin-group; a second semiconductor fin; and a third semiconductor fin, with the third semiconductor fin being closest to the second fin-group among the first fin-group; and performing an epitaxy process to form an epitaxy region based on the plurality of semiconductor fins, wherein the epitaxy region comprises a first portion in middle between the first semiconductor fin and the second semiconductor fin, wherein the first portion has a first top surface; and a second portion in middle between the second semiconductor fin and the third semiconductor fin, wherein the second portion has a second top surface lower than the first top surface. In an embodiment, the first portion comprises a first highest point laterally between the first semiconductor fin and the second semiconductor fin, and the epitaxy region further comprises a third portion directly over the third semiconductor fin, with the third portion having a second highest point, and the first highest point is higher than the second highest point. In an embodiment, a top surface of the epitaxy region has a recess laterally between the second semiconductor fin and the third semiconductor fin. In an embodiment, the recess has a depth in a range between about 3 nm and about 15 nm. In an embodiment, a portion of the epitaxy region between the first semiconductor fin and the second semiconductor fin has a convex top surface. In an embodiment, the method further includes forming a silicide region, wherein the forming the silicide region comprises removing the portion of the epitaxy region having the convex top surface to form a concave top surface of the epitaxy region; and forming the silicide region on the concave top surface of the epitaxy region.

In accordance with some embodiments of the present disclosure, a method includes forming a first fin-group and a second fin-group, wherein the first fin-group comprises a plurality of semiconductor fins with inner-group spacings, and the first fin-group comprising a first semiconductor fin farthest from the second fin-group, a second semiconductor fin, and a third semiconductor fin closest to the second fin-group; forming a gate stack on the first fin-group; forming gate spacers on sidewalls of the gate stack; forming fin spacers comprising a first outer fin spacer facing toward the second fin-group, wherein the first outer fin spacer has a first height; a second outer fin spacer facing away from the second fin-group, wherein the second outer fin spacer has a second height greater than the first height; and inner spacers between the first outer fin spacer and the second outer fin spacer; performing epitaxy processes to form a first epitaxy region based on the first fin-group, and a second epitaxy region based on the second fin-group; and forming a source/drain contact plug electrically interconnecting the first epitaxy region and the second epitaxy region. In an embodiment, the fin spacers are formed to have the inner spacers as having heights smaller than the first height and the second height. In an embodiment, the first fin-group and the second fin-group have an inter-group spacing greater than the inner-group spacings. In an embodiment, the source/drain contact plug has a bottom having a portion overlapping the first epitaxy region, wherein the bottom is tilted, with portions of the bottom closer to the second fin-group being lower than portions of the bottom farther away from the second fin-group. In an embodiment, the first epitaxy region comprises a top surface, and the top surface comprises a first portion laterally between, and higher than, the first semiconductor fin and the second semiconductor fin, wherein the first portion has a convex top surface; and a second portion laterally between the second semiconductor fin and the third semiconductor fin, wherein the second portion has a concave top surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   isolation regions;
   a first semiconductor fin, a second semiconductor fin, and a third semiconductor fin protruding higher than top surfaces of the isolation regions, wherein the first semiconductor fin, the second semiconductor fin, and the third semiconductor fin are in a first fin-group;
   a second fin-group comprising a fourth semiconductor fin and a fifth semiconductor fin, wherein inner-fin spacings in the first fin-group and the second fin-group are smaller than an inter-fin spacing that separates the first fin-group from the second fin-group;
   a gate stack on a side of the first semiconductor fin, the second semiconductor fin, and the third semiconductor fin;
   gate spacers on sidewalls of the gate stack;
   a first epitaxy region over and contacting the first semiconductor fin, the second semiconductor fin, and the third semiconductor fin, wherein the first epitaxy region comprises a top surface, and wherein the top surface comprises:
      a first concave portion higher than, and laterally between, the first semiconductor fin and the second semiconductor fin; and
      a second concave portion higher than, and laterally between, the second semiconductor fin and the third semiconductor fin; and
   a second epitaxy region over and contacting the second fin-group.

2. The device of claim 1, wherein a first lowest point of the first concave portion is lower than a second lowest point of the second concave portion, and wherein the first concave portion is between the second concave portion and the second fin-group.

3. The device of claim 2, wherein the first lowest point of the first concave portion is lower than the second lowest point of the second concave portion by a difference greater than about 3 nm.

4. The device of claim 1 further comprising a plurality of fin spacers on sidewalls of the first semiconductor fin, the second semiconductor fin, and the third semiconductor fin, wherein outer fin spacers in the plurality of fin spacers and on outer sides of the first fin-group are higher than inner fin spacers in the first fin-group.

5. The device of claim 1 further comprising a silicide region over and the contacting the top surface of the first epitaxy region, and wherein the silicide region comprises an additional top surface comprising:
   a third concave portion and a fourth concave portion overlapping the first concave portion and the second concave portion, respectively.

6. The device of claim 5, wherein the silicide region comprises a low portion between the first fin-group and the second fin-group, and the low portion is further lower than the third concave portion and the fourth concave portion of the additional top surface of the silicide region.

7. The device of claim 1, wherein the top surface of the first epitaxy region is a top surface of a first layer in the first epitaxy region, and the first epitaxy region further comprises a second layer over and contacting side portions of the first layer, and wherein the first layer has a first germanium atomic percentage different from a second germanium atomic percentage in the second layer.

8. The device of claim 1, wherein the first epitaxy region is of p-type.

9. The device of claim 1, wherein the first semiconductor fin is comprised in an elongated fin, and the elongated fin comprises:
   a first portion being the first semiconductor fin, wherein the first portion is higher than the isolation regions; and
   a second portion directly underlying the gate stack, wherein the second portion is higher than the isolation regions, and wherein the first portion has a first top surface lower than a second top surface of the second portion.

10. A device comprising:
a first fin-group and a second fin-group, wherein each of the first fin-group and the second fin-group comprises a plurality of semiconductor fins having inner-group spacings, and wherein the first fin-group and the second fin-group are spaced apart from each other by an inter-group spacing greater than the inner-group spacings, and wherein the first fin-group comprises:
a first semiconductor fin, with the first semiconductor fin being farthest from the second fin-group among the first fin-group;
a second semiconductor fin; and
a third semiconductor fin, with the third semiconductor fin being closest to the second fin-group among the first fin-group; and
an epitaxy region over and contacting the first fin-group, the epitaxy region comprising:
a first portion laterally between the first semiconductor fin and the second semiconductor fin, wherein the first portion has a first top surface; and
a second portion laterally between the second semiconductor fin and the third semiconductor fin, wherein the second portion has a second top surface lower than the first top surface.

11. The device of claim 10, wherein the first portion has a first recess, and the second portion has a second recess.

12. The device of claim 11, wherein the second recess is shallower than the first recess.

13. The device of claim 11, wherein the first recess and the second recess have a first lowest point and a second lowest point, respectively, and wherein the first lowest point is higher than the second lowest point.

14. The device of claim 10 further comprising a dielectric isolation region continuously extending from the third semiconductor fin to the second fin-group.

15. The device of claim 10 further comprising dielectric isolation regions on opposing sides of the plurality of semiconductor fins, wherein the first top surface and the second top surface are higher than top surfaces of the dielectric isolation regions.

16. The device of claim 15 further comprising fin spacers on sidewalls of the plurality of semiconductor fins, wherein the first top surface of the first portion is further higher than top ends of the fin spacers.

17. The device of claim 10, wherein the epitaxy region is of p-type.

18. A device comprising:
a first fin-group and a second fin-group, each comprising a plurality of semiconductor fins;
fin spacers on sidewalls of the plurality of semiconductor fins in the first fin-group, the fin spacers comprising:
a first outer fin spacer facing toward the second fin-group, wherein the first outer fin spacer has a first height;
a second outer fin spacer facing away from the second fin-group, wherein the second outer fin spacer has a second height greater than the first height; and
inner fin spacers between the first outer fin spacer and the second outer fin spacer;
a first epitaxy region over and contacting the first fin-group;
a second epitaxy region over and contacting the second fin-group; and
a source/drain contact plug electrically interconnecting the first epitaxy region and the second epitaxy region.

19. The device of claim 18, wherein first top ends of the inner fin spacers are lower than second ends of the first outer fin spacer and the second outer fin spacer.

20. The device of claim 18, wherein the inner fin spacers comprise:
a first inner fin spacer; and
a second inner fin spacer closer to the second outer fin spacer than the first inner fin spacer, wherein the second inner fin spacer is shorter than the first inner fin spacer.

* * * * *